United States Patent

Hiramoto et al.

(10) Patent No.: US 6,632,520 B1
(45) Date of Patent: Oct. 14, 2003

(54) MAGNETIC FILM

(75) Inventors: Masayoshi Hiramoto, Nara (JP); Nozomu Matsukawa, Nara (JP); Hiroshi Sakakima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/387,404

(22) Filed: Sep. 2, 1999

(30) Foreign Application Priority Data

Sep. 3, 1998 (JP) .......................................... 10-249360

(51) Int. Cl.⁷ .................. B32B 15/00; B32B 15/04; B32B 15/18; G11B 5/127; G11B 5/187
(52) U.S. Cl. ................ 428/336; 428/632; 428/627; 428/694 TM; 428/693; 428/694 TS; 360/110; 360/126
(58) Field of Search ............... 428/611, 678, 428/679, 680, 681, 682, 332, 213, 692, 693, 694 MM, 694 TM, 698, 699, 900, 336, 632, 627, 694 T, 694 TS; 360/119, 125, 126, 319, 313, 113, 110; 148/300, 304, 306, 320

(56) References Cited

U.S. PATENT DOCUMENTS

| | | | | |
|---|---|---|---|---|
| 5,117,321 A | * | 5/1992 | Nakanishi et al. | 360/120 |
| 5,227,193 A | * | 7/1993 | Hori et al. | 427/131 |
| 5,543,989 A | | 8/1996 | Westwood | 360/113 |
| 5,686,193 A | | 11/1997 | Westwood | 428/611 |
| 5,849,400 A | * | 12/1998 | Hiramoto et al. | 428/213 |
| 5,939,186 A | * | 8/1999 | Tokutake et al. | 428/332 |
| 6,027,824 A | * | 2/2000 | Suwabe et al. | 428/682 |

FOREIGN PATENT DOCUMENTS

JP 2603433 1/1997

* cited by examiner

*Primary Examiner*—Michael LaVilla
(74) *Attorney, Agent, or Firm*—Renner, Otto, Boisselle & Sklar, LLP

(57) ABSTRACT

Magnetic film comprising a substantially crystalline magnetic layer and an intermediate layer alternately formed in contact with each other, wherein the magnetic layer has composition $(M_1\alpha_1X_1\beta_1)_{100-\delta_1}A_1\delta_1$ ($\alpha_1$, $\beta_1$, and $\delta_1$ represent % by atomic weight; $M_1$ is at least one of Fe, Co, and Ni; $X_1$ is at least one of Mg, Ca, Sr, Ba, Si, Ge, Sn, Al, Ga, and transition metals excluding $M_1$; and $A_1$ is at least one of O and N), wherein:

$0.1 \leq \beta_1 \leq 12$ $\alpha_1 + \beta_1 = 100$ $0 < \delta_1 \leq 10$;

the intermediate layer has composition $(M_2\alpha_2X_2\beta_2)_{100-\delta_2}A_2\delta_2$ ($\alpha_2$, $\beta_2$, and $\delta_2$ represent % by atomic weight; $M_2$ is at least one of Fe, Co, and Ni; $X_2$ is at least one of Mg, Ca, Sr, Ba, Si, Ge, Sn, Al, Ga, Ge and transition metals excluding the $M_2$; and $A_2$ is O), wherein:

$0.1 \leq \beta_2 \leq 80$ $\alpha_2 + \beta_2 = 100$ $\delta_1 \leq \delta_2 \leq 67$.

28 Claims, 32 Drawing Sheets

| | Thickness of a magnetic layer T1 (nm) | Thickness of an intermediate layer T2 (nm) | T1/T2 | Coercivity (Oe) | Bs (T) |
|---|---|---|---|---|---|
| Comparative example aa | 70 | 0.2 | 350 | 14.0 | 1.91 |
| Comparative example ab | 70 | 0.4 | 175 | 10.5 | 1.90 |
| Example aa | 70 | 1.4 | 50 | 1.9 | 1.89 |
| Example ab | 70 | 2.0 | 35 | 1.0 | 1.86 |
| Example ac | 70 | 5.0 | 14 | 0.7 | 1.79 |
| Example ad | 70 | 7.0 | 10 | 0.7 | 1.74 |
| Example ae | 70 | 10.0 | 7 | 0.8 | 1.67 |
| Example af | 70 | 15.0 | 4.7 | 1.0 | 1.57 |
| Comparative example ac | 70 | 20.0 | 3.5 | 1.2 | 1.48 |

FIG. 1

| | Thickness of a magnetic layer T1 (nm) | Thickness of an intermediate layer T2 (nm) | T1/T2 | Coercivity (Oe) | Bs (T) |
|---|---|---|---|---|---|
| Comparative example aa | 70 | 0.2 | 350 | 14.0 | 1.91 |
| Comparative example ab | 70 | 0.4 | 175 | 10.5 | 1.90 |
| Example aa | 70 | 1.4 | 50 | 1.9 | 1.89 |
| Example ab | 70 | 2.0 | 35 | 1.0 | 1.86 |
| Example ac | 70 | 5.0 | 14 | 0.7 | 1.79 |
| Example ad | 70 | 7.0 | 10 | 0.7 | 1.74 |
| Example ae | 70 | 10.0 | 7 | 0.8 | 1.67 |
| Example af | 70 | 15.0 | 4.7 | 1.0 | 1.57 |
| Comparative example ac | 70 | 20.0 | 3.5 | 1.2 | 1.48 |

FIG. 2

| | Thickness of a magnetic layer T1 (nm) | Thickness of an intermediate layer T2 (nm) | T1/T2 | Coercivity (Oe) | Bs (T) |
|---|---|---|---|---|---|
| Comparative example ba | 1 | 0.4 | 2.5 | 24.0 | 1.36 |
| Example ba | 2 | 0.4 | 5 | 1.8 | 1.59 |
| Example bb | 5 | 0.4 | 12.5 | 1.2 | 1.77 |
| Example bc | 10 | 0.4 | 25 | 1.5 | 1.84 |
| Example bd | 20 | 0.4 | 50 | 1.7 | 1.88 |
| Comparative example bb | 30 | 0.4 | 75 | 8.5 | 1.89 |

FIG.3

| | Thickness of a magnetic layer T1 (nm) | Thickness of an intermediate layer T2 (nm) | T1/T2 | Coercivity (Oe) | Bs (T) |
|---|---|---|---|---|---|
| Comparative example ca | 15 | 5 | 3 | 1.5 | 1.43 |
| Example ca | 20 | 5 | 4 | 0.9 | 1.53 |
| Example cb | 50 | 5 | 10 | 0.7 | 1.74 |
| Example cc | 70 | 5 | 14 | 0.7 | 1.79 |
| Example cd | 100 | 5 | 20 | 0.8 | 1.82 |
| Example ce | 150 | 5 | 30 | 1.5 | 1.85 |
| Comparative example cb | 200 | 5 | 40 | 4.8 | 1.87 |

FIG.4

| | Thickness of a magnetic layer T1 (nm) | Thickness of an intermediate layer T2 (nm) | T1/T2 | Coercivity (Oe) | Bs (T) |
|---|---|---|---|---|---|
| Comparative example da | 50 | 15 | 3.3 | 0.9 | 1.47 |
| Example da | 60 | 15 | 4 | 0.9 | 1.53 |
| Example db | 70 | 15 | 4.7 | 1.0 | 1.57 |
| Example dc | 100 | 15 | 6.7 | 1.2 | 1.66 |
| Example dd | 150 | 15 | 10 | 1.5 | 1.74 |
| Comparative example db | 170 | 15 | 11.3 | 2.3 | 1.76 |

FIG. 5

| | Thickness of a magnetic layer T1 (nm) | Thickness of an intermediate layer T2 (nm) | T1/T2 | Coercivity (Oe) | Bs (T) |
|---|---|---|---|---|---|
| Comparative example ea | 1 | 2 | 0.5 | 7.3 | 1.23 |
| Example ea | 2 | 2 | 1 | 1.8 | 1.50 |
| Example eb | 10 | 2 | 5 | 0.9 | 1.82 |
| Example ec | 20 | 2 | 10 | 1.1 | 1.86 |
| Example ed | 50 | 2 | 25 | 1.7 | 1.89 |
| Comparative example eb | 100 | 2 | 50 | 1.9 | 1.90 |
| Comparative example ec | 120 | 2 | 60 | 3.2 | 1.91 |

FIG. 6

| | Magnetic layer | Coercivity (Oe) | Bs (T) |
|---|---|---|---|
| Comparative example fa | Fe | 5.0 | 2.00 |
| Example fa | $Fe_{99.9}Si_{0.1}$ | 2.5 | 1.96 |
| Example fb | $Fe_{98}Si_{2}$ | 1.4 | 1.89 |
| Example fc | $Fe_{94}Si_{6}$ | 0.7 | 1.79 |
| Example fd | $Fe_{88}Si_{12}$ | 0.5 | 1.59 |
| Comparative example fb | $Fe_{85}Si_{15}$ | 0.4 | 1.49 |

FIG. 7

| | Magnetic layer | Coercivity (Oe) |
|---|---|---|
| Example ga | $Fe_{98}Si_{1.5}$ | 1.5 |
| Example gb | $(Fe_{98}Si_{1.5})_{99}O_1$ | 1.1 |
| Example gc | $(Fe_{98}Si_{1.5})_{98}O_2$ | 1.5 |
| Example gd | $(Fe_{98}Si_{1.5})_{95}N_5$ | 0.9 |
| Example ge | $(Fe_{98}Si_{1.5})_{90}N_{10}$ | 1.5 |
| Example gf | $(Fe_{98}Si_{1.5})_{94}O_1N_5$ | 1.3 |
| Example gg | $(Fe_{98}Si_{1.5})_{90}O_1N_9$ | 1.9 |
| Comparative example ga | $(Fe_{98}Si_{1.5})_{89}O_3N_8$ | 4.4 |
| Comparative example gb | $(Fe_{98}Si_{1.5})_{89}O_2N_9$ | 3.4 |

FIG. 8

| | Intermediate layer | Coercivity (Oe) |
|---|---|---|
| Example ha | $(Fe_{96}Si_4)_{99}O_1$ | 2.8 |
| Example hb | $(Fe_{96}Si_4)_{97}O_3$ | 2.4 |
| Example hc | $(Fe_{96}Si_4)_{45}O_{55}$ | 1.1 |
| Example hd | $(Fe_{96}Si_4)_{95}N_5$ | 2.5 |
| Example he | $(Fe_{96}Si_4)_{70}N_{30}$ | 1.3 |
| Example hf | $(Fe_{96}Si_4)_{70}O_{10}N_{20}$ | 1.4 |
| Example hg | $(Fe_{96}Si_4)_{35}O_{60}N_5$ | 1.2 |
| Example hh | $(Fe_{96}Si_4)_{33}N_{67}$ | 1.1 |
| Comparative example ha | $Fe_{97.5}Si_{3.5}$ | 11.5 |
| Comparative example hb | $(Fe_{96}Si_4)_{30}N_{70}$ | 2.5 (Surface roughness) |

FIG. 9

| Intermediate layer | | Coercivity (Oe) | Processing speed of an intermediate layer (nm/min) |
|---|---|---|---|
| Example ia | $(Fe_{20}Ti_{80})_{45}O_{55}$ | 1.0 | 15 |
| Example ib | $(Fe_{20}Cr_{80})_{45}O_{55}$ | 1.2 | 12 |
| Example ic | $(Fe_{20}V_{80})_{45}O_{55}$ | 1.1 | 11 |
| Example id | $(Fe_{70}Si_{30})_{45}O_{55}$ | 0.9 | 15 |
| Example ie | $(Fe_{70}Al_{30})_{45}O_{55}$ | 0.8 | 15 |
| Comparative example ia | $(Fe_{5}Ti_{95})_{45}O_{55}$ | 1.2 | 5 |
| Comparative example ib | $(Fe_{5}Cr_{95})_{45}O_{55}$ | 1.3 | 6 |
| Comparative example ic | $(Fe_{5}V_{95})_{45}O_{55}$ | 1.2 | 6 |
| Comparative example id | $(Fe_{10}Si_{90})_{45}O_{55}$ | 1.1 | 5 |
| Comparative example ie | $(Fe_{10}Al_{90})_{45}O_{55}$ | 1.1 | 6 |

FIG. 10

| | Composition of magnetic layer (at%) | Coercivity (Oe) |
|---|---|---|
| Comparative example ja | Fe (Single layer) | 21.0 |
| Comparative example jb | Fe | 5.2 |
| Example ja | $Fe_{97}Si_3$ | 0.9 |
| Example jb | $(Fe_{96}Si_4)_{98}O_2$ | 1.0 |
| Example jc | $(Fe_{95}Si_5)_{92}N_8$ | 0.9 |
| Example jd | $(Fe_{95}Si_5)_{92}O_2N_6$ | 1.0 |
| Example je | $Fe_{98}Al_2$ | 1.4 |
| Example jf | $(Fe_{97}Al_3)_{98}O_2$ | 1.6 |
| Example jg | $(Fe_{95}Al_5)_{93}N_7$ | 1.5 |
| Example jh | $(Fe_{95}Al_5)_{92}O_2N_6$ | 1.7 |
| Example ji | $Fe_{98}Ti_2$ | 2.1 |
| Example jj | $(Fe_{97}Ti_3)_{98}O_2$ | 1.7 |
| Example jk | $(Fe_{96}Ti_4)_{93}N_7$ | 1.6 |
| Example jl | $(Fe_{96}Ti_4)_{92}O_2N_6$ | 1.8 |
| Example jm | $Fe_{98}V_2$ | 2.2 |
| Example jn | $(Fe_{97}V_3)_{98}O_2$ | 2.1 |
| Example jo | $(Fe_{95}V_5)_{93}N_7$ | 1.9 |
| Example jp | $(Fe_{95}V_5)_{92}O_2N_6$ | 1.8 |
| Example jq | $Fe_{98}Cr_2$ | 2.1 |
| Example jr | $(Fe_{97}Cr_3)_{98}O_2$ | 2.3 |
| Example js | $(Fe_{95}Cr_5)_{93}N_7$ | 1.8 |
| Example jt | $(Fe_{95}Cr_5)_{92}O_2N_6$ | 1.7 |
| Example ju | $(Fe_{96}Rh_4)_{92}N_8$ | 3.6 |
| Example jv | $(Fe_{96}Rh_4)_{92}O_2N_6$ | 3.7 |

FIG.11

| | Composition of magnetic layer (at%) | Coercivity (Oe) |
|---|---|---|
| Example jw | $Fe_{98}Ta_2$ | 1.9 |
| Example jx | $(Fe_{97}Ta_3)_{98}O_2$ | 2.1 |
| Example jy | $(Fe_{96}Ta_5)_{92}N_8$ | 1.7 |
| Example jz | $(Fe_{95}Ta_5)_{92}O_2N_6$ | 1.9 |
| Example ka | $Fe_{96}Si_3Al_1$ | 0.9 |
| Example kb | $Fe_{96}Si_3Ti_1$ | 0.9 |
| Example kc | $Fe_{96}Si_3V_1$ | 1.0 |
| Example kd | $Fe_{96}Si_3Cr_1$ | 1.1 |
| Example ke | $Fe_{96}Si_3Nb_1$ | 0.9 |
| Example kf | $Fe_{96}Si_3Ta_1$ | 1.5 |
| Example kg | $Fe_{96}Si_3Zn_1$ | 1.2 |
| Example kh | $(Fe_{94}Si_5Al_1)_{92}N_8$ | 1.2 |
| Example ki | $(Fe_{94}Si_5Ti_1)_{92}N_8$ | 1.1 |
| Example kj | $(Fe_{94}Si_5V_1)_{92}N_8$ | 1.3 |
| Example kk | $(Fe_{94}Si_5Cr_1)_{92}N_8$ | 1.4 |
| Example kl | $(Fe_{94}Si_5Nb_1)_{92}N_8$ | 1.2 |
| Example km | $(Fe_{94}Si_5Ta_1)_{92}N_8$ | 1.1 |
| Example kn | $(Fe_{94}Si_5Zn_1)_{92}N_8$ | 1.6 |
| Example ko | $(Fe_{94}Si_5Al_1)_{93}O_2N_5$ | 1.2 |
| Example kp | $(Fe_{94}Si_5Ti_1)_{93}O_2N_5$ | 1.1 |
| Example kq | $(Fe_{94}Si_5V_1)_{93}O_2N_5$ | 1.3 |
| Example kr | $(Fe_{94}Si_5Cr_1)_{93}O_2N_5$ | 1.6 |
| Example ks | $(Fe_{94}Si_5Nb_1)_{93}O_2N_5$ | 1.2 |
| Example kt | $(Fe_{94}Si_5Ta_1)_{93}O_2N_5$ | 1.4 |
| Example ku | $(Fe_{94}Si_5Zn_1)_{93}O_2N_5$ | 1.6 |

FIG. 12

| | Composition of magnetic layer (at%) | Coercivity (Oe) |
|---|---|---|
| Example kv | $Fe_{97}Al_2Ti_1$ | 1.5 |
| Example kw | $Fe_{97}Al_2V_1$ | 1.3 |
| Example kx | $Fe_{97}Al_2Cr_1$ | 1.6 |
| Example ky | $Fe_{97}Al_2Nb_1$ | 1.7 |
| Example kz | $Fe_{97}Al_2Ta_1$ | 1.5 |
| Example la | $Fe_{97}Al_2Zn_1$ | 1.9 |
| Example lb | $(Fe_{96}Al_2Ti_2)_{92}N_8$ | 1.2 |
| Example lc | $(Fe_{96}Al_2V_2)_{92}N_8$ | 1.4 |
| Example ld | $(Fe_{96}Al_2Cr_2)_{92}N_8$ | 1.5 |
| Example le | $(Fe_{96}Al_2Nb_2)_{92}N_8$ | 1.4 |
| Example lf | $(Fe_{96}Al_2Ta_2)_{92}N_8$ | 1.6 |
| Example lg | $(Fe_{96}Al_2Zn_2)_{92}N_8$ | 1.7 |
| Example lh | $(Fe_{96}Al_2Ti_2)_{92}O_2N_6$ | 1.5 |
| Example li | $(Fe_{96}Al_2V_2)_{92}O_2N_6$ | 1.8 |
| Example lj | $(Fe_{96}Al_2Cr_2)_{92}O_2N_6$ | 1.9 |
| Example lk | $(Fe_{96}Al_2Nb_2)_{92}O_2N_6$ | 1.7 |
| Example ll | $(Fe_{96}Al_2Ta_2)_{92}O_2N_6$ | 1.5 |
| Example lm | $(Fe_{96}Al_2Zn_2)_{92}O_2N_6$ | 2.3 |
| Example ln | $Fe_{97}Ti_2V_1$ | 1.9 |
| Example lo | $Fe_{97}Ti_2Cr_1$ | 2.2 |
| Example lp | $Fe_{97}Ti_2Nb_1$ | 2.1 |
| Example lq | $Fe_{97}Ti_2Ta_1$ | 1.9 |
| Example lr | $Fe_{97}Ti_2Zn_1$ | 2.5 |
| Example ls | $(Fe_{97}Ti_2V_2)_{92}N_8$ | 1.8 |
| Example lt | $(Fe_{97}Ti_2Cr_2)_{92}N_8$ | 1.9 |
| Example lu | $(Fe_{97}Ti_2Nb_2)_{92}N_8$ | 1.6 |
| Example lv | $(Fe_{97}Ti_2Ta_2)_{92}N_8$ | 1.9 |
| Example lw | $(Fe_{97}Ti_2Zn_2)_{92}N_8$ | 2.1 |
| Example lx | $(Fe_{97}Ti_2V_2)_{92}O_2N_6$ | 1.9 |
| Example ly | $(Fe_{97}Ti_2Cr_2)_{92}O_2N_6$ | 2.1 |
| Example lz | $(Fe_{97}Ti_2Nb_2)_{92}O_2N_6$ | 2.0 |
| Example ma | $(Fe_{97}Ti_2Ta_2)_{92}O_2N_6$ | 2.1 |
| Example mb | $(Fe_{97}Ti_2Zn_2)_{92}O_2N_6$ | 2.5 |
| Example mc | $Fe_{97}V_2Cr_1$ | 2.1 |
| Example md | $Fe_{97}V_2Nb_1$ | 2.0 |
| Example me | $Fe_{97}V_2Ta_1$ | 1.9 |
| Example mf | $Fe_{97}V_2Zn_1$ | 2.5 |
| Example mg | $(Fe_{96}V_2Cr_2)_{92}N_8$ | 1.8 |
| Example mh | $(Fe_{96}V_2Nb_2)_{92}N_8$ | 1.9 |
| Example mi | $(Fe_{96}V_2Ta_2)_{92}N_8$ | 1.9 |
| Example mj | $(Fe_{96}V_2Zn_2)_{92}N_8$ | 1.3 |
| Example mk | $(Fe_{96}V_2Cr_2)_{92}O_2N_6$ | 1.7 |
| Example ml | $(Fe_{96}V_2Nb_2)_{92}O_2N_6$ | 2.1 |
| Example mm | $(Fe_{96}V_2Ta_2)_{92}O_2N_6$ | 2.3 |
| Example mn | $(Fe_{96}V_2Zn_2)_{92}O_2N_6$ | 1.8 |
| Example mo | $Fe_{97}Nb_2Ta_1$ | 2.8 |
| Example mp | $Fe_{97}Nb_2Zn_1$ | 2.7 |
| Example mq | $(Fe_{96}Nb_2Ta_2)_{92}N_8$ | 2.1 |
| Example mr | $(Fe_{96}Nb_2Zn_2)_{92}N_8$ | 2.5 |
| Example ms | $(Fe_{96}Nb_2Ta_2)_{92}O_2N_6$ | 2.1 |
| Example mt | $(Fe_{96}Nb_2Zn_2)_{92}O_2N_6$ | 2.2 |
| Example mu | $(Fe_{95}Si_3Al_1Ti_1)_{92}O_2N_6$ | 1.2 |
| Example mv | $(Fe_{96}Si_3Al_1V_1)_{92}O_2N_6$ | 1.1 |
| Example mw | $(Fe_{96}Si_3Al_1Cr_1)_{92}O_2N_6$ | 1.3 |

FIG. 13

| | Composition of magnetic layer at% | Coercivity Oe |
|---|---|---|
| Example mx | $(Fe_{95}Si_3Al_1Nb_1)_{92}O_2N_6$ | 1.1 |
| Example my | $(Fe_{95}Si_3Al_1Ta_1)_{92}O_2N_6$ | 1.2 |
| Example mz | $(Fe_{95}Si_3Al_1Hf_1)_{92}O_2N_6$ | 1.4 |
| Example na | $(Fe_{95}Si_3Al_1Rh_1)_{92}O_2N_6$ | 1.7 |
| Example nb | $(Fe_{95}Si_3Ti_1V_1)_{92}O_2N_6$ | 1.2 |
| Example nc | $(Fe_{95}Si_3Ti_1Cr_1)_{92}O_2N_6$ | 1.3 |
| Example nd | $(Fe_{95}Si_3Ti_1Nb_1)_{92}O_2N_6$ | 1.1 |
| Example ne | $(Fe_{95}Si_3Ti_1Ta_1)_{92}O_2N_6$ | 1.1 |
| Example nf | $(Fe_{95}Si_3Ti_1Hf_1)_{92}O_2N_6$ | 1.3 |
| Example ng | $(Fe_{95}Si_3Ti_1Rh_1)_{92}O_2N_6$ | 1.6 |
| Example nh | $(Fe_{95}Si_3V_1Cr_1)_{92}O_2N_6$ | 1.7 |
| Example ni | $(Fe_{95}Si_3V_1Nb_1)_{92}O_2N_6$ | 1.6 |
| Example nj | $(Fe_{95}Si_3V_1Ta_1)_{92}O_2N_6$ | 1.5 |
| Example nk | $(Fe_{95}Si_3V_1Hf_1)_{92}O_2N_6$ | 1.6 |
| Example nl | $(Fe_{95}Si_3V_1Rh_1)_{92}O_2N_6$ | 2.2 |
| Example nm | $(Fe_{95}Si_3Cr_1Nb_1)_{92}O_2N_6$ | 1.5 |
| Example nn | $(Fe_{95}Si_3Cr_1Ta_1)_{92}O_2N_6$ | 1.6 |
| Example no | $(Fe_{95}Si_3Cr_1Hf_1)_{92}O_2N_6$ | 1.8 |
| Example np | $(Fe_{95}Si_3Cr_1Rh_1)_{92}O_2N_6$ | 2.1 |
| Example nq | $(Fe_{95}Si_3Nb_1Ta_1)_{92}O_2N_6$ | 1.9 |
| Example nr | $(Fe_{95}Si_3Nb_1Hf_1)_{92}O_2N_6$ | 2.2 |
| Example ns | $(Fe_{95}Si_3Nb_1Rh_1)_{92}O_2N_6$ | 2.5 |
| Example nt | $(Fe_{95}Si_3Ta_1Hf_1)_{92}O_2N_6$ | 1.8 |
| Example nu | $(Fe_{95}Si_3Ta_1Rh_1)_{92}O_2N_6$ | 2.3 |
| Example nv | $(Fe_{95}Si_3Ti_1V_1)_{92}O_2N_6$ | 2.1 |

FIG.14

| | Composition of magnetic layer at% | Coercivity Oe |
|---|---|---|
| Example nw | $(Fe_{95}Al_3Ti_1Cr_1)_{92}O_2N_6$ | 2.0 |
| Example nx | $(Fe_{95}Al_3Ti_1Nb_1)_{92}O_2N_6$ | 1.9 |
| Example ny | $(Fe_{95}Al_3Ti_1Ta_1)_{92}O_2N_6$ | 1.8 |
| Example nz | $(Fe_{95}Al_3Ti_1Hf_1)_{92}O_2N_6$ | 2.2 |
| Example oa | $(Fe_{95}Al_3Ti_1Rh_1)_{92}O_2N_6$ | 2.6 |
| Example ob | $(Fe_{95}Al_3V_1Cr_1)_{92}O_2N_6$ | 2.1 |
| Example oc | $(Fe_{95}Al_3V_1Nb_1)_{92}O_2N_6$ | 2.2 |
| Example od | $(Fe_{95}Al_3V_1Ta_1)_{92}O_2N_6$ | 2.4 |
| Example oe | $(Fe_{95}Al_3V_1Hf_1)_{92}O_2N_6$ | 2.8 |
| Example of | $(Fe_{95}Al_3V_1Rh_1)_{92}O_2N_6$ | 3.0 |
| Example og | $(Fe_{95}Al_3Cr_1Nb_1)_{92}O_2N_6$ | 2.2 |
| Example oh | $(Fe_{95}Al_3Cr_1Ta_1)_{92}O_2N_6$ | 2.4 |
| Example oi | $(Fe_{95}Al_3Cr_1Hf_1)_{92}O_2N_6$ | 2.8 |
| Example oj | $(Fe_{95}Al_3Cr_1Rh_1)_{92}O_2N_6$ | 3.2 |
| Example ok | $(Fe_{95}Al_3Nb_1Ta_1)_{92}O_2N_6$ | 1.9 |
| Example ol | $(Fe_{95}Al_3Nb_1Hf_1)_{92}O_2N_6$ | 2.1 |
| Example om | $(Fe_{95}Al_3Nb_1Rh_1)_{92}O_2N_6$ | 2.8 |
| Example on | $(Fe_{95}Al_3Ta_1Hf_1)_{92}O_2N_6$ | 2.2 |
| Example oo | $(Fe_{95}Al_3Ta_1Rh_1)_{92}O_2N_6$ | 3.0 |
| Example op | $(Fe_{95}Ti_3V_1Cr_1)_{92}O_2N_6$ | 2.1 |
| Example oq | $(Fe_{95}Ti_3V_1Nb_1)_{92}O_2N_6$ | 1.9 |
| Example or | $(Fe_{95}Ti_3V_1Ta_1)_{92}O_2N_6$ | 1.8 |
| Example os | $(Fe_{95}Ti_3V_1Hf_1)_{92}O_2N_6$ | 1.9 |
| Example ot | $(Fe_{95}Ti_3V_1Rh_1)_{92}O_2N_6$ | 3.2 |
| Example ou | $(Fe_{95}Ti_3Cr_1Nb_1)_{92}O_2N_6$ | 2.2 |
| Example ov | $(Fe_{95}Ti_3Cr_1Ta_1)_{92}O_2N_6$ | 2.1 |

FIG. 15

| | Composition of magnetic layer at% | Coercivity Oe |
|---|---|---|
| Example ow | $(Fe_{95}Ti_3Cr_1Hf_1)_{92}O_2N_6$ | 2.3 |
| Example ox | $(Fe_{95}Ti_3Cr_1Rh_1)_{92}O_2N_6$ | 2.8 |
| Example oy | $(Fe_{95}Ti_3Nb_1Ta_1)_{92}O_2N_6$ | 2.5 |
| Example oz | $(Fe_{95}Ti_3Nb_1Hf_1)_{92}O_2N_6$ | 2.7 |
| Example pa | $(Fe_{95}Ti_3Nb_1Rh_1)_{92}O_2N_6$ | 3.3 |
| Example pb | $(Fe_{95}Ti_3Ta_1Hf_1)_{92}O_2N_6$ | 2.2 |
| Example pc | $(Fe_{95}Ti_3Ta_1Rh_1)_{92}O_2N_6$ | 3.0 |
| Example pd | $(Fe_{95}V_3Cr_1Nb_1)_{92}O_2N_6$ | 1.9 |
| Example pe | $(Fe_{95}V_3Cr_1Ta_1)_{92}O_2N_6$ | 1.8 |
| Example pf | $(Fe_{95}V_3Cr_1Hf_1)_{92}O_2N_6$ | 1.9 |
| Example pg | $(Fe_{95}V_3Cr_1Rh_1)_{92}O_2N_6$ | 3.5 |
| Example ph | $(Fe_{95}V_3Nb_1Ta_1)_{92}O_2N_6$ | 2.5 |
| Example pi | $(Fe_{95}V_3Nb_1Hf_1)_{92}O_2N_6$ | 2.7 |
| Example pj | $(Fe_{95}V_3Nb_1Rh_1)_{92}O_2N_6$ | 3.1 |
| Example pk | $(Fe_{95}V_3Ta_1Hf_1)_{92}O_2N_6$ | 2.9 |
| Example pl | $(Fe_{95}V_3Ta_1Rh_1)_{92}O_2N_6$ | 3.3 |
| Example pm | $(Fe_{95}Cr_3Nb_1Ta_1)_{92}O_2N_6$ | 2.5 |
| Example pn | $(Fe_{95}Cr_3Nb_1Hf_1)_{92}O_2N_6$ | 2.8 |
| Example po | $(Fe_{95}Cr_3Nb_1Rh_1)_{92}O_2N_6$ | 3.4 |
| Example pp | $(Fe_{95}Cr_3Ta_1Hf_1)_{92}O_2N_6$ | 2.9 |
| Example pq | $(Fe_{95}Cr_3Ta_1Rh_1)_{92}O_2N_6$ | 3.2 |
| Example pr | $(Fe_{95}Nb_3Ta_1Hf_1)_{92}O_2N_6$ | 2.6 |
| Example ps | $(Fe_{95}Nb_3Ta_1Rh_1)_{92}O_2N_6$ | 3.5 |

FIG.16

| | Thickness of magnetic thin film T3 (nm) | Thickness of high-resistant layer T4 (nm) | T3/T4 | Magnetic permeability (100MHz) | Magnetic permeability (300MHz) | Bs (T) |
|---|---|---|---|---|---|---|
| Example qa | 100 | 10 | 10 | 700 | 650 | 1.73 |
| Example qb | 300 | 10 | 30 | 750 | 680 | 1.83 |
| Example qc | 500 | 10 | 50 | 800 | 650 | 1.86 |
| Example qd | 1000 | 10 | 100 | 800 | 430 | 1.88 |
| Comparative example qa | 1500 | 10 | 150 | 500 | 200 | 1.89 |
| Comparative example qb | 100 | 50 | 2 | 300 | 250 | 1.27 |
| Comparative example qc | 300 | 50 | 6 | 450 | 400 | 1.63 |
| Example qe | 500 | 50 | 10 | 600 | 500 | 1.72 |
| Example qf | 1000 | 50 | 20 | 600 | 400 | 1.81 |
| Comparative example qd | 1500 | 50 | 30 | 450 | 150 | 1.84 |

FIG.17

| | Thickness of magnetic thin film T3 (nm) | Thickness of high-resistant layer T4 (nm) | T3/T4 | Magnetic permeability (100MHz) | Magnetic permeability (300MHz) | Bs (T) |
|---|---|---|---|---|---|---|
| Comparative example ra | 500 | 2 | 250 | 200 | 130 | 1.89 |
| Example ra | 500 | 2 | 250 | 1100 | 950 | 1.89 |
| Example rb | 500 | 2 | 250 | 1000 | 900 | 1.89 |
| Example rc | 500 | 2 | 250 | 1300 | 1200 | 1.89 |

Magnetic thin film (or magnetic layer) and high-resistant layer are alternately formed to be multi-layered

FIG. 19A

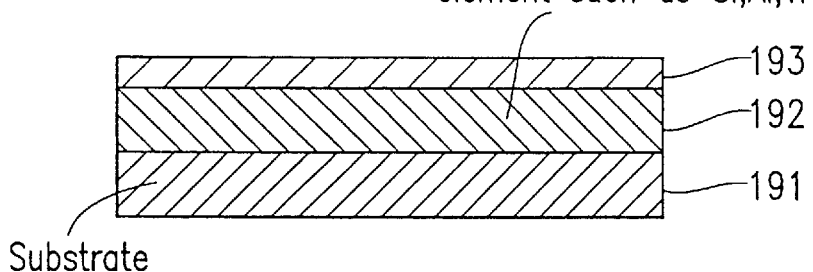

Magnetic thin film or magnetic layer containing an oxygen-compatible element such as Si, Al, Ti and Cr — 193
— 192
— 191
Substrate

FIG. 19B

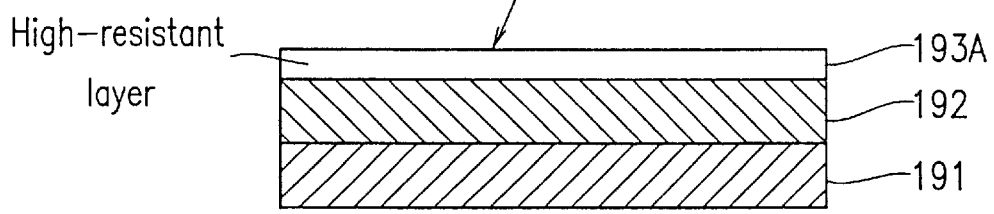

Treatment in an atmosphere of oxygen/oxygen plasma or nitrogen/nitrogen plasma

High-resistant layer — 193A
— 192
— 191

FIG. 19C

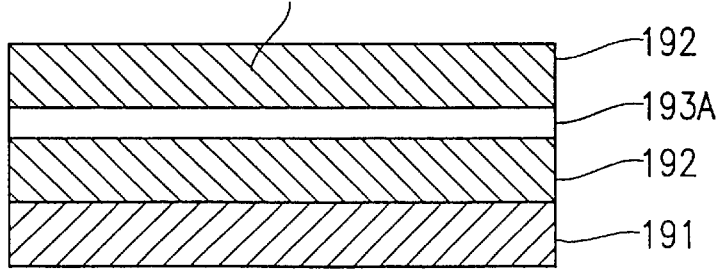

Magnetic thin film or magnetic layer containing an oxygen-compatible element such as Si, Al, Ti and Cr

190

— 192
— 193A
— 192
— 191

Magnetic thin film (or magnetic layer) high-resistant layer are alternately formed to be multi-layered

FIG.20

| | Composition of high-resistant magnetic film | Coercivity (Oe) | $100 \times \tau/\beta/(m \times \delta + n \times \varepsilon)$ (at%) |
|---|---|---|---|
| Comparative example sa | $Fe_{70}O_{30}$ | — | — |
| Comparative example sb | $Fe_{54}Co_{16}O_{30}$ | — | — |
| Comparative example sc | $Fe_{40}Mg_{12}Ca_{10}O_{38}$ | 10.0 | 1.7 |
| Comparative example sd | $Fe_{48}Mg_{14}Ca_{12}O_{26}$ | 8.0 | 1.0 |
| Comparative example se | $Fe_{80}Mg_4Ca_4O_{12}$ | 0.7 | 1.5 (70 $\mu\Omega$cm) |
| Comparative example sf | $Co_{50}Mg_{15}O_{25}$ | 7.0 | 2.5 |
| Example sa | $Fe_{78}Mg_5Ca_5O_{12}$ | 0.9 | 1.2 |
| Example sb | $Fe_{70}Mg_2Ca_5O_{23}$ | 0.6 | 1.4 |
| Example sc | $Fe_{45}Mg_{13}Ca_{12}O_{40}$ | 2.2 | 1.6 |
| Example sd | $Co_{50}Fe_{21}Mg_{10}O_{19}$ | 2.5 | 1.9 |
| Example se | $Co_{33}Fe_{14}Mg_{23}O_{30}$ | 2.9 | 1.3 |
| Example sf | $Fe_{53}Si_{15}Al_2Ti_2N_{28}$ | 2.2 | 1.1 |
| Example sg | $Co_{70}Mg_{10}O_{20}$ | 2.5 | 2.0 |

FIG.21

| | Composition of high-resistant magnetic film (at%) | Magnetic permeability (100MHz) |
|---|---|---|
| Example ta | $Co_{56}Al_{11}O_{33}$ | 700 |
| Example tb | $Co_{77}Mg_{10}O_{13}$ | 800 |
| Example tc | $Co_{72}Ca_{12}O_{16}$ | 950 |
| Example td | $Fe_{50}Al_{17}O_{33}$ | 800 |
| Example te | $Fe_{74}Mg_{11}O_{15}$ | 1800 |
| Example tf | $Fe_{72}Ca_{12}O_{16}$ | 1200 |
| Example tg | $Co_{43}Fe_{19}Mg_{16}O_{22}$ | 1300 |
| Example th | $Co_{48}Fe_{21}Ca_{13}O_{18}$ | 1200 |
| Example ti | $Co_{46}Fe_{20}Al_{10}O_{24}$ | 1000 |
| Comparative example ta | $Co_{56}Al_{11}O_{33}$ | 200 |
| Comparative example tb | $Co_{77}Mg_{10}O_{13}$ | 100 |
| Comparative example tc | $Co_{72}Ca_{12}O_{16}$ | 50 |
| Comparative example td | $Fe_{50}Al_{17}O_{33}$ | 200 |
| Comparative example te | $Fe_{74}Mg_{11}O_{15}$ | 100 |
| Comparative example tf | $Fe_{72}Ca_{12}O_{16}$ | 150 |
| Comparative example tg | $Co_{43}Fe_{19}Mg_{16}O_{22}$ | 100 |
| Comparative example th | $Co_{48}Fe_{21}Ca_{13}O_{18}$ | 50 |
| Comparative example ti | $Co_{46}Fe_{20}Al_{10}O_{24}$ | 100 |

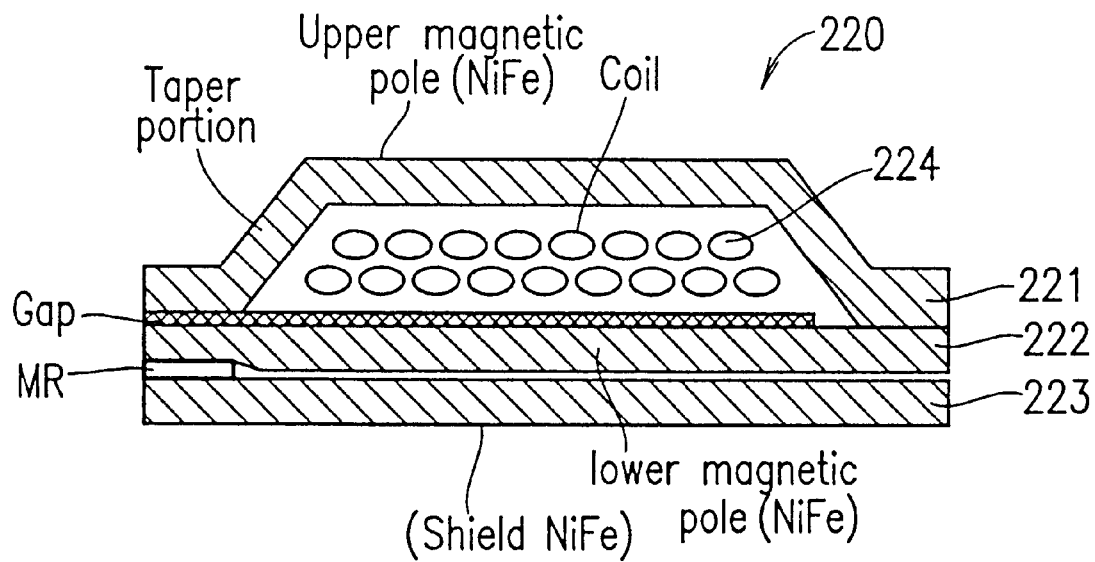
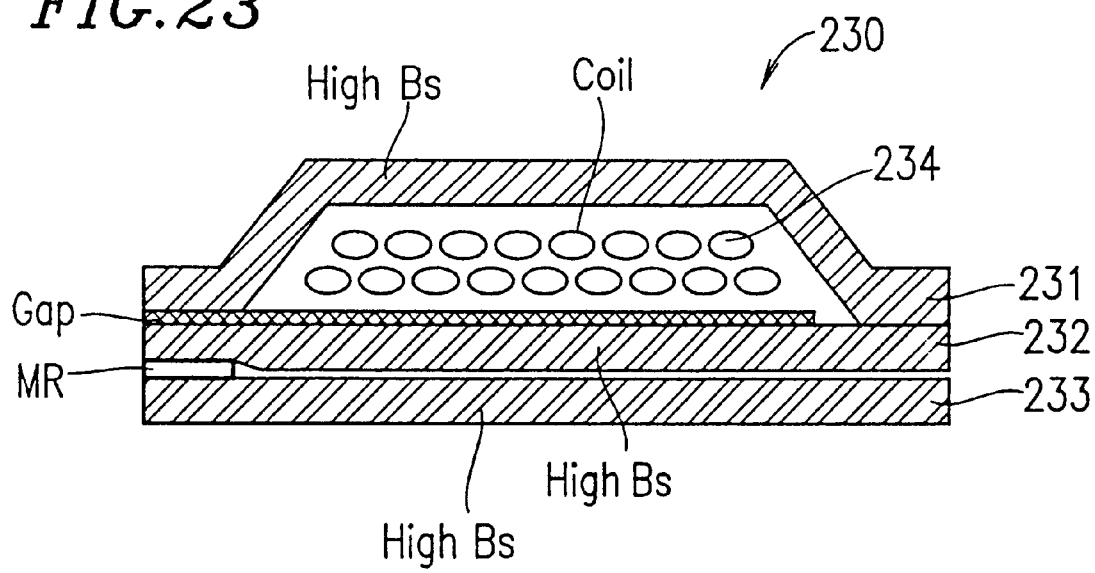

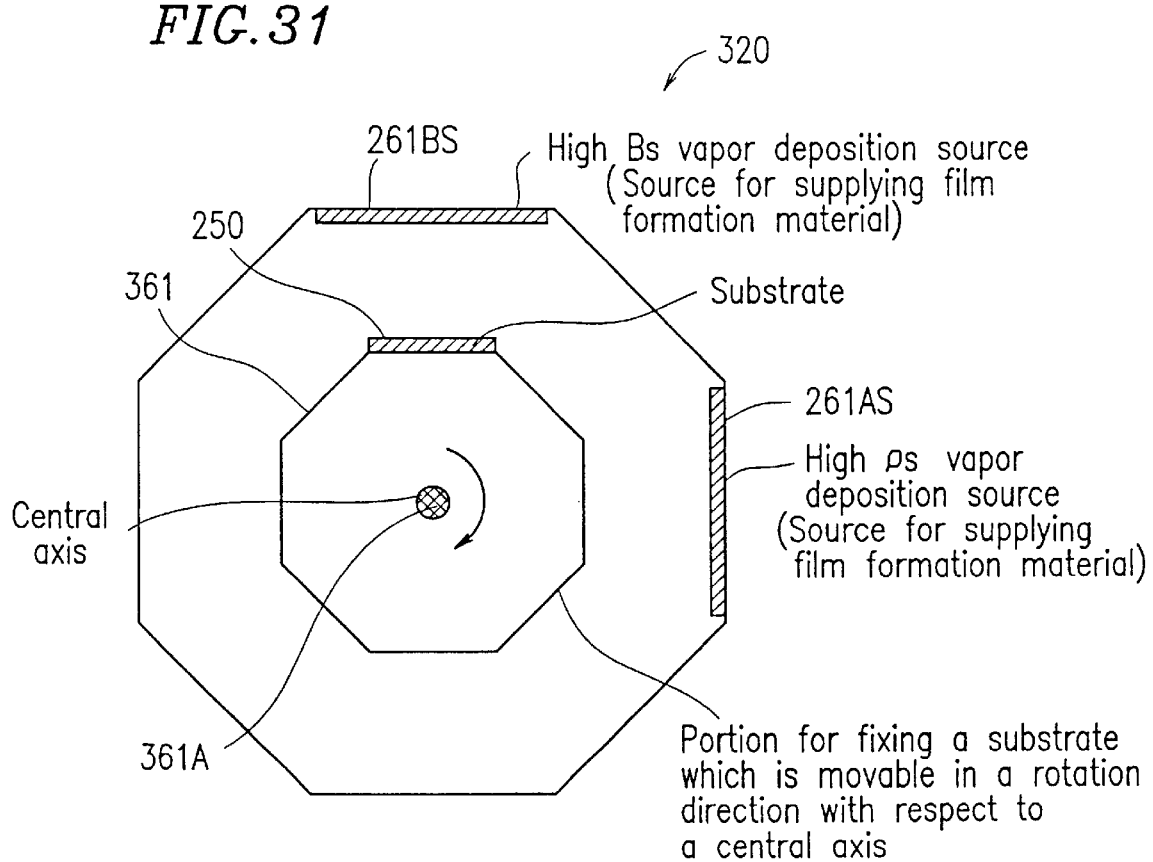

FIG.34

| | Overwrite characteristics (dB) |
|---|---|
| Comparative example ua | 0 |
| Example ua | −26 |
| Example ub | −21 |
| Example uc | −35 |
| Example ud | −31 |
| Example ue | −28 |
| Example uf | −25 |
| Example ug | −23 |
| Example uh | −21 |

FIG. 37

| | Change angle (Degree) | Hc of magnetization difficult axis (Oe) | Direction of magnetization difficult axis |
|---|---|---|---|
| Comparative example va | 0 | 50 | Target longitudinal direction |
| Example va | 20 | 2.5 | Target shorter direction (Movement direction) |
| Example vb | 30 | 2 | Target shorter direction (Movement direction) |
| Example vc | 40 | 2.5 | Target shorter direction (Movement direction) |

Prior Art

MAGNETIC FILM

BACKGROUND OF THE INVENTION

1. Field of the Invention

The present invention relates to a magnetic film having a high saturated magnetic flux density used in a recording head and a magnetic reproducing head of a hard disk drive (HDD), a magnetic sensor such as a magnetic impedance sensor, and a magnetic circuit component such as a magnetic coil and an inductor; a method for producing the magnetic film; and a thin film head using the magnetic film.

2. Description of the Related Art

In recent years, the maximum recording frequency of HDDs has remarkably increased to about 200 MHz. Furthermore, high-density recording media are likely to have a high coercivity. Therefore, there has been a demand for a recording head material which has a high effective magnetic permeability even at a high frequency and in which a magnetic pole is unlikely to be saturated (i.e., a recording head material which has a high resistivity (high $\rho$), strong uniaxial anisotropy, and a high saturated magnetic flux density (high Bs)).

In order to satisfy the above-mentioned demand, F—N type material such as FeCrN (J. Appl. Phy. 81(8), Apr. 15, 1997) and FeRhN (IEEE Trans. Magn. VVOl 133. No. 5, 1997) formed by sputtering has been reported as a materiel, for example, with Bs of 2 T (tesla) or more.

The above-mentioned material with high Bs has a low resistivity; therefore, it is difficult to use such material at a high frequency. However, it has been reported that such material is used with a non-magnetic insulator ($Al_2O_3$, $SiO_2$, etc.) so as to suppress an eddy current loss (The Japan Society of Applied Magnetics, document of The 103 th Research Institute, p. 2, 1998).

As shown in FIG. 40, U.S. Pat. Nos. 5,543,989 and 5,686,193 disclose a magnetic film with magnetic pole end regions 119 and 123, including a layered structure of a seed layer of sendust and a bulk layer of sendust.

As material for a single layer with high $\rho$, Fe—M—O (M=Hf, Zr) (Summary of the lecture in the 122 nd Japan Society of Metal, p. 179 (424) 1998) is known; however, it has a disadvantage of low Bs. It is required that the above-mentioned material with high Bs or high $\rho$ is capable of providing uniaxial anisotropy and suppressing a ferromagnetic resonance loss. For this purpose, heat treatment in a magnetic field or film formation in a magnetic field is conducted.

However, even in the case where uniaxial anisotropy is given to a conventional film with high Bs, a recording magnetic pole used in a thin film head has an increased aspect ratio between the thickness and the width of a magnetic pole due to a decreased width of a track. Therefore, magnetic anisotropy is caused by an anti-magnetic field in a direction perpendicular to the surface of a recording gap between an upper magnetic pole and a lower magnetic pole.

Because of the above, the direction of a magnetization easy axis shifts in the direction perpendicular to the film surface, which complicates a domain structure in the entire magnetic pole. As a result, magnetic characteristics at a high frequency degrade.

Furthermore, in the case where a magnetic pole is formed by a layered structure including a conventional layer with high Bs and an insulation resistant layer, it is required that at least two sources for supplying material are used for forming the layer with high Bs and the insulation resistant layer, and that these layers are alternately formed, which results in a longer period of time of film formation.

Furthermore, in performing a dry etching technique for minute processing (i.e., patterning of a magnetic pole), an etching rate of a magnetic material of transition metal such as Fe, Co, and Ni is substantially different from that of a non-magnetic insulating material such as $Al_2O_3$ and $SiO_2$. Thus, for example, in the case where radical etching or reactive ion etching (RIE) with a high etching rate is conducted, since these reactions are isotropic, unevenness is formed on cross-sections of the magnetic layer and the non-magnetic insulating layer. Furthermore, when reactive gas to be used for each layer is varied, a processing speed as a whole is decreased due to gas substitution, and a device becomes complicated.

Furthermore, in the case where the above-mentioned film is used in high-frequency recording, a spin valve film is used for a reproducing head. At least one of the magnetic layers included in the spin valve film is a fixed layer whose magnetization is fixed in a direction of medium magnetization, and the direction of fixed magnetization is orthogonal to the direction of uniaxial anisotropy required for a recording magnetic pole film for a high frequency.

The recording magnetic film which has been conventionally developed is produced while uniaxial anisotropy is obtained. Alternatively, after the recording magnetic film is produced, uniaxial anisotropy is formed by heat treatment in a magnetic field. Therefore, anisotropy of the recording magnetic film is weakened due to the heat treatment in a magnetic field conducted for fixing the fixed layer of the spin valve film in a preferable direction of the fixed magnetization.

Furthermore, when an upper magnetic pole is formed, the quality of a slope portion degrades due to oblique formation.

SUMMARY OF THE INVENTION

A magnetic film of the present invention includes a magnetic layer and an intermediate layer alternately formed, wherein the magnetic layer has a composition represented by $(M_1\alpha_1 X_1\beta_1)_{100-\delta_1} A_1\delta_1$ (where $\alpha_1$, $\beta_1$, and $\delta_1$ represent % by atomic weight; $M_1$ is at least one magnetic metal selected from the group consisting of Fe, Co, and Ni; $X_1$ is at least one selected from the group consisting of Mg, Ca, Sr, Ba, Si, Ge, Sn, Al, Ga, and transition metals excluding the $M_1$; and $A_1$ is at least one selected from the group consisting of O and N), the magnetic layer has the following composition range:

$0.1 \leq \beta_1 \leq 12$
$\alpha_1 + \beta_1 = 100$
$0 < \delta_1 \leq 10$ the intermediate layer has a composition represented by $(M_2\alpha_2 X_2\beta_2)_{100-\delta_2} A_2\delta_2$ (where $\alpha_2$, $\beta_2$, and $\delta_2$ represent % by atomic weight; $M_2$ is at least one magnetic metal selected from the group consisting of Fe, Co, and Ni; $X_2$ is at least one selected from the group consisting of Mg, Ca, Sr, Ba, Si, Ge, Sn, Al, Ga, and transition metals excluding the $M_1$; and $A_2$ is at least one selected from the group consisting of O and N), the intermediate layer has the following composition range:

$0.1 \leq \beta_2 \leq 80$
$\alpha_2 + \beta_2 = 100$
$\delta_1 \leq \delta_2 \leq 67$ In one embodiment of the present invention, the $X_1$ contains at least one selected from the group consisting of Si, Al, Ti, and V.

In another embodiment of the present invention, $M_1=M_2$ and $X_1=X_2$.

In another embodiment of the present invention, $A_2$ contains O.

In another embodiment of the present invention, assuming that an average thickness of the magnetic layer is $T_1$ and an average thickness of the intermediate layer is $T_2$, the following expressions are satisfied:

2 nm$\leq T_1 \leq$150 nm 0.4 nm$\leq T_2 \leq$15 nm $1 \leq T_1/T_2 \leq 50$

In another embodiment of the present invention, the magnetic film satisfies the following expressions:

20 nm$<T_1 \leq$150 nm 1 nm$<T_2 \leq$15 nm $4 \leq T_1/T_2 \leq 50$ at least 50% of magnetic crystal grains included in the adjacent magnetic layers via the intermediate layer spread across the intermediate layer.

A magnetic film of the present invention includes a magnetic layer and an intermediate layer alternately formed, wherein the magnetic layer has a composition represented by $(M_1\alpha_1 X_1\beta_1)_{100-\delta_1}A_1\delta_1$ (where $\alpha_1$, $\beta_1$, and $\delta_1$ represent % by atomic weight, $M_1$ is at least one magnetic metal selected from the group consisting of Fe, Co, and Ni; $X_1$ is at least one selected from the group consisting of Mg, Ca, Sr, Ba, Si, Ge, Al, Ga, and transition metals including a IVa group, a Va group, and Cr; and $A_1$ is at least one selected from the group consisting of O and N), the magnetic layer has the following composition range:

$0.1 \leq \beta_1 \leq 12$ $\alpha_1+\beta_1=100$ $0 \leq \delta_1 \leq 10$ the intermediate layer has a composition represented by $(M_2\alpha_2 X_2\beta_2)_{100-\delta_2}A_2\delta_2$ (where $\alpha_2$, $\beta_2$, and $\delta_2$ represent % by atomic weight, $M_2$ is at least one magnetic metal selected from the group consisting of Fe, Co, and Ni; $X_2$ is at least one selected from the group consisting of Mg, Ca, Sr, Ba, Si, Al, Ga, Ge, and transition metals including a IVa group, a Va group, and Cr; and $A_2$ is at least one selected from the group consisting of O and N), the intermediate layer has the following composition range:

$0.1 \leq \beta_2 \leq 80$ $\alpha_2+\beta_2=100$ $\delta_1<\delta_2 \leq 67$

In one embodiment of the present invention, the $X_1$ contains at least one selected from the group consisting of Si, Al, Ti, and V.

In another embodiment of the present invention, $M_1=M_2$ and $X_1=X_2$.

In another embodiment of the present invention, $A_2$ contains O.

In another embodiment of the present invention, assuming that an average thickness of the magnetic layer is $T_1$ and an average thickness of the intermediate layer is $T_2$, the following expressions are satisfied:

2 nm$\leq T_1 \leq$150 nm 0.4 nm$\leq T_2 \leq$15 nm $1 \leq T_1/T_2 \leq 50$

In another embodiment of the present invention, the magnetic film satisfies the following expressions:

20 nm$<T_1 \leq$150 nm 1 nm$<T_2 \leq$15 nm $4 \leq T_1/T_2 \leq 50$ at least 50% of magnetic crystal grains included in the adjacent magnetic layers via the intermediate layer spread across the intermediate layer.

A magnetic film of the present invention includes a magnetic layer and an intermediate layer alternately formed, wherein the magnetic layer has a composition represented by $(M_1\alpha_1 X_1\beta_1 Z_1\gamma_1)_{100-\delta_1}A_1\delta_1$ (where $\alpha_1$, $\beta_1$, $\gamma_1$, and $\delta_1$ represent % by atomic weight; $M_1$ is at least one magnetic metal selected from the group consisting of Fe, Co, and Ni; $X_1$ is at least one selected from the group consisting of Mg, Ca, Sr, Ba, Si, Al, Ga, Ge and transition metals including a IVa group, a Va group, and Cr; $Z_1$ is at least one selected from the group consisting of Zn, Rh, Ru, and Pt; and $A_1$ is at least one selected from the group consisting of O and N), the magnetic layer has the following composition range:

$0.1 \leq \beta_1 \leq 12$ $0.1 \leq \gamma_1 \leq 8$ $\alpha_1+\beta_1+\gamma_1=100$ $0 \leq \delta_1 \leq 10$ the intermediate layer has a composition represented by $(M_2\alpha_2 X_2\beta_2 Z_2\gamma_2)_{100-\delta_2}A_2\delta_2$ (where $\alpha_2$, $\beta_2$, $\gamma_2$, and $\delta_2$ represent % by atomic weight, $M_2$ is at least one magnetic metal selected from the group consisting of Fe, Co, and Ni; $X_2$ is at least one selected from the group consisting of Mg, Ca, Sr, Ba, Si, Al, Ga, Ge, and transition metals including a IVa group, a Va group, and Cr; $Z_2$ is at least one selected from the group consisting of Rh, Ru, and Pt; and $A_2$ is at least one selected from the group consisting of O and N), the intermediate layer has the following composition range:

$0.1 \leq \beta_2 \leq 80$ $0.1 \leq \gamma_2 \leq 80$ $\alpha_2+\beta_2+\gamma_2=100$ $\delta_1<\delta_2 \leq 67$ In one embodiment of the present invention, the $X_1$ contains at least one selected from the group consisting of Si, Al, Ti, and V.

In another embodiment of the present invention, $M_1=M_2$ and $X_1=X_2$.

In another embodiment of the present invention, $A_2$ contains O.

In another embodiment of the present invention, assuming that an average thickness of the magnetic layer is $T_1$ and an average thickness of the intermediate layer is $T_2$, the following expressions are satisfied:

2 nm$\leq T_1 \leq$150 nm 0.4 nm$\leq T_2 \leq$15 nm $1 \leq T_1/T_2 \leq 50$

In another embodiment of the present invention, the magnetic film satisfies the following expressions:

20 nm$<T_1 \leq$150 nm 1 nm$<T_2 \leq$15 nm $4 \leq T_1/T_2 \leq 50$ at least 50% of magnetic crystal grains included in the adjacent magnetic layers via the intermediate layer spread across the intermediate layer.

A high-resistant magnetic film of the present invention has a composition represented by $M\alpha X\beta(N\delta O\epsilon)\gamma$ (where $\alpha$, $\beta$, $\gamma$, $\delta$, and $\epsilon$ represent % by atomic weight; M is at least one magnetic metal selected from the group consisting of Fe, Co, and Ni; X is at least one selected from the group consisting of Mg, Ca, Sr, Ba, Si, Ge, Sn, Al, Ga, and transition metals excluding the M), wherein assuming that a chemical formula when the X forms a nitride with a lowest nitride generation free energy is $XN_m$, and a chemical formula when the X forms an oxide with a lowest oxygen generation free energy is $XO_n$, the high-resistant magnetic film has the following composition range:

$\alpha+\beta+\gamma=100$ $45 \leq \alpha \leq 78$ $\delta+\epsilon=100$ $1<100 \times \gamma/\beta/(m \times \delta + n \times \epsilon)<2.5$ the high-resistant magnetic film contains crystal grains, and a shortest diameter of each of the crystal grains is 20 nm or less.

A magnetic multilayer with high resistivity of the present invention includes a magnetic layer and an intermediate layer alternately formed, wherein the magnetic layer includes a high-resistant magnetic film, the high-resistant magnetic film and the intermediate layer have compositions represented by $M_{1m1}X_{1n1}A_{1q1}$ and $M_{2m2}X_{2n2}A_{2q2}$, respectively (where m1, n1, q1, m2, n2, and q2 represent % by atomic weight; $M_1$ and $M_2$ are at least one magnetic metal selected from the group consisting of Fe, Co, and Ni; $X_1$ and $X_2$ are at least one selected from the group consisting of Mg, Ca, Sr, Ba, Si, Ge, Sn, Al, Ga, and transition metals excluding the magnetic metal; and $A_1$ and $A_2$ represent at least one selected from the group consisting of O and N), and the high-resistant magnetic film and the intermediate layer satisfy the following expressions:

$M_1=M_2$, $X_1=X_2$ $q1<q2$

A method for producing a high-resistant layer of the present invention, includes the steps of: forming a low-resistant layer containing 10% by atomic weight or more of at least one element selected from the group consisting of Mg, Ca, Sr, Ba, Si, Ge, Sn, Al, Ga, and transition metals excluding the $M_1$ on either one of a magnetic thin film and a magnetic layer; and oxidizing or nitriding the low-resistant layer in an atmosphere selected from the group consisting of oxygen, nitrogen, oxygen plasma, and nitrogen plasma.

In one embodiment of the present invention, the magnetic thin film or the magnetic layer contains an element compatible with oxygen.

A magnetic multilayer of the present invention includes a magnetic thin film and a high-resistant layer alternately formed, wherein assuming that an average thickness of the magnetic thin film is $T_3$, and an average thickness of the high-resistant layer is $T_4$ the following expressions are satisfied:

$100 \text{ nm} \leq T_3 \leq 1000 \text{ nm}$ $2 \text{ nm} \leq T_4 \leq 50 \text{ nm}$ $10 \leq T_3/T_4 \leq 500$ In one embodiment of the present invention, the magnetic thin film includes a magnetic layer and an intermediate layer, the magnetic layer, the intermediate layer, and the high-resistant layer have compositions represented by $M_1X_1A_1$, $M_2X_2A_2$, and $M_3X_3A_3$, respectively (where $M_1$ to $M_3$ are at least one magnetic metal selected from the group consisting of Fe, Co, and Ni; $X_1$, $X_2$, and $X_3$ are at least one selected from the group consisting of Mg, Ca, Sr, Ba, Si, Ge, Sn, Al, Ga, and transition metals excluding the magnetic metal; and $A_1$, $A_2$, and $A_3$ are at least one selected from the group consisting of O and N), and the magnetic layer, the intermediate layer, and the high-resistant layer at least satisfy the conditions: $M_1=M_2=M_3$, and $X_1=X_2=X_3$.

A thin film head of the present invention includes an upper magnetic pole and a lower magnetic pole, wherein the upper magnetic pole includes either one of a high-resistant magnetic film and a magnetic multilayer with high resistivity, having a specific resistance of 80 $\mu\Omega$cm or more, and either one of a magnetic thin film and a magnetic multilayer, the upper magnetic pole and the lower magnetic pole form a recording gap, and either one of the magnetic thin film and the magnetic multilayer is formed at least in the vicinity of the recording gap at an end of the upper magnetic pole.

In one embodiment of the present invention, either one of the magnetic thin film and the magnetic multilayer is formed at least in the recording gap, and either one of the high-resistant magnetic film and the magnetic multilayer with high resistivity, having a specific resistance of 80 $\mu\Omega$cm or more is formed on either one of the magnetic thin film and the magnetic multilayer.

A method for producing a thin film of the present invention, includes: a first step of moving a substrate onto which a film is formed and a source for supplying material for forming a film in a relative manner; and a second step of forming at least one of a magnetic thin film, a magnetic multilayer, a high-resistant magnetic film, and a magnetic multilayer with high resistivity, wherein at least one magnetization difficult axis of the magnetic thin film, the magnetic multilayer, the high-resistant magnetic film, and the magnetic multilayer with high resistivity is formed in a movement direction in which the substrate and the source are moved in a relative manner.

In one embodiment of the present invention, the movement direction includes a depth direction of an upper magnetic pole of a thin film head.

In another embodiment of the present invention, the first step includes forming a film by a vapor growth method for generating a magnetic field of 50 Oe or more which is substantially orthogonal to the movement direction, substantially parallel to a film formation surface on the substrate, substantially uniform, and substantially in one direction.

In another embodiment of the present invention, the first step includes forming a film by changing a concentration of oxygen, oxygen plasma, nitrogen, or nitrogen plasma in a vapor growth apparatus.

In another embodiment of the present invention, a temperature of the substrate during formation of a film is substantially 300° C. or less.

A hard disk drive using the above-mentioned magnetic film as a magnetic pole.

A hard disk drive using the above-mentioned magnetic film as a part of a shield.

A hard disk drive using the above-mentioned high-resistant magnetic film as a magnetic pole.

A hard disk drive using the above-mentioned high-resistant magnetic film as a part of a shield.

A hard disk drive using the above-mentioned magnetic multilayer with high resistivity as a magnetic pole.

A hard disk drive using the above-mentioned magnetic multilayer with high resistivity as a part of a shield.

A hard disk drive using the above-mentioned magnetic multilayer as a magnetic pole.

A hard disk drive using the above-mentioned magnetic multilayer as a part of a shield.

A hard disk drive using the above-mentioned thin film head.

According to an aspect of the present invention, a magnetic film having outstanding soft magnetic characteristics at a high frequency and high Bs can be obtained for the following reason. Magnetic layers are magnetically separated by an intermediate layer, whereby the magnetic layers disposed via the intermediate layer decrease domain wall energy due to their magnetostatic binding or the intermediate layer suppresses the growth of magnetic crystal grains so as to refine them. Thus, apparent crystal magnetic anisotropy is decreased (so-called refining effect), which enhances soft magnetic characteristics.

Furthermore, even in the case where the thickness and width of a film have a high aspect ratio during refining of the film, shape anisotropy magnetic energy in a direction perpendicular to the film is suppressed, so that outstanding high-frequency characteristics can be exhibited. Particularly, in the case where a magnetic film of magnetostatic binding type is used in the vicinity of a recording gap of an upper magnetic pole of a thin film head, the magnetization of magnetic layers separated by an intermediate layer causes magnetostatic binding on the side face of the magnetic pole, and is likely to be directed in a preferable magnetization direction similarly to the case where apparent uniaxial anisotropy is formed; therefore, high-frequency characteristics are enhanced without conducting heat treatment in a magnetic field or forming a film in a magnetic field.

$M_1$ may be any of Fe, a FeCo alloy, and a FeCoNi alloy. $X_1$ contained in a magnetic layer has at least one effect such as enhancing corrosion resistance, refining crystal grains of magnetic metal, decreasing crystal magnetic anisotropy of magnetic crystal grains, and decreasing magnetostriction, as long as its amount is at least about 0.1%. Zn, Pt, Rh, Ru, and the like enhance corrosion resistance, Cr, Ge, Ga, V, Al, Si, Ti, and Mo decrease crystal magnetic anisotropy, and Ti, Si, and Sn decrease magnetostriction, for example, in the case where $M_1$ is Fe. Although one kind of $M_1$ has an effect, two or more kinds of $M_1$ will have more remarkable effect of decreasing a crystal grain diameter. Furthermore, the addition of Al further decreases a crystal grain diameter, which has an effect of enhancing soft magnetic characteristics. If $\beta_1$ is more than about 12%, and $\delta_1$ is more than about 10%, Bs is decreased, which is not preferable.

An intermediate layer contains transition metal. Therefore, even when RIE involving generation of carbonyl of transition metal is used, a fine pattern can be relatively easily formed. In terms of processability, it is preferable that transition metal such as Cr and Pt is used for an intermediate layer. In terms of suppressing an eddy current loss between layers, a high-resistant oxide such as $SiO_2Al_2O_3$ is preferably used. The intermediate layer of the present invention uses an oxide, a nitride, or material consisting of an oxide and a nitride having relatively small energy of dissociation, so that the intermediate layer allows a high resistance to such a degree as to realize relatively satisfactory processability and sufficiently suppress an eddy current.

Furthermore, $X_2$ contained in the intermediate layer forms a reactive product with $A_2$ to promote separation from the magnetic layer. $X_2$ also has an outstanding effect on magnetostatic binding and refining crystal grains, even in the case where the intermediate layer of the present invention has a composition or a thickness which does not suppress an eddy current. $X_2$ exhibits its effect in an amount of about 0.1% or more. When the amount is more than about 80%, processability for patterning to a fine shape becomes poor or magnetic degradation is caused due to internal stress or strain.

It is required that $\delta_2$ contains an O or N concentration higher than that of $\delta_{67\ 1}$. When the $\delta_2$ concentration exceeds about 67%, excess oxygen or nitrogen gas is discharged from the intermediate layer in the course of heat treatment at a temperature higher than a film formation temperature, which may damage a film. Thus, the $\delta_2$ concentration is about 67% or less.

In the magnetic thin film with the above-mentioned structure where $M_1=M_2$ and $X_1=X_2$, by using an intermediate layer having the same element as that of the magnetic layer, interface energy occurring between the intermediate layer and the magnetic layer is suppressed. Therefore, magnetoelastic energy caused by internal stress generated on the interface and anisotropy energy in the film can be decreased. As a result, a magnetic film having outstanding soft magnetic characteristics and high Bs can be obtained. Furthermore, in the case where the intermediate layer of the magnetic thin film with the structure of the present invention has a thickness sufficient for realizing magnetostatic binding, vertical magnetization generated by interface strain can be suppressed; therefore, a domain structure is realized in which magnetostatic binding works more effectively.

Furthermore, interface energy is relatively low. Therefore, it is not required to form a film at a high temperature for the purpose of removing strain energy during film formation or after film formation, or to conduct heat treatment for removing strain at a high temperature. This allows soft magnetic characteristics to be easily obtained by a process at a low temperature (about 300° C. or less). Furthermore, in the case where layers of different materials are formed, when materials with low interface energy are combined, inter-layer peeling is likely to be caused. However, according to the present invention, the element common to the magnetic layer and the intermediate layer functions as glue, so that the layered film of the present invention has high strength. Furthermore, since $M_1=M_2$ and $X_1=X_2$ are satisfied, in the case where a vapor deposition, for example, is used, one source for supplying film formation material suffices to easily form a film. In the case of the structure of the present invention, even when the composition of each magnetic layer and intermediate layer is continuously varied, the same effect can be obtained.

According to another aspect of the present invention, $X_2$ contained in the intermediate layer is capable of easily generating a reaction product with $A_2$, due to its low oxide generation free energy. Thus, even when the intermediate layer is relatively thin, it has appropriate separation effect between the magnetic layers.

According to still another aspect of the present invention, at least one selected from the group consisting of Rh, Ru, and Pt is added to the magnetic layer and the intermediate layer, respectively, whereby corrosion resistance of thin film material is remarkably enhanced. The content of these elements of about 0.1% or more is effective, whereas the content of about 8% or more will decrease a saturated magnetic flux density, and degrade soft magnetic characteristics.

Furthermore, in the magnetic thin film with the above-mentioned structure in which $X_1$ is at least one selected from the group consisting of Si, Al, Ti, and V, in the case where a trace amount of Si, Al, Ti, and V is contained in crystal grains included in the magnetic layer, crystal magnetic anisotropy energy is decreased. This results in a refining effect and a decrease in domain wall energy. Thus, more outstanding soft magnetic characteristics can be obtained. When these elements react with O or N in the magnetic layer, the growth of crystal grains is suppressed, and a refining effect is enhanced. In the case where these elements are contained in the intermediate layer, since any of these elements has large free energy for generating an oxygen or a nitrogen and has a large diffusion constant, the intermediate layer can be effective with a relatively small thickness. Such a relatively thin intermediate layer allows the magnetostatic binding between the magnetic layers to strengthen; therefore, a decrease in domain wall energy is large, and a decrease in a saturated magnetic flux density in the entire film caused by the intermediate layer is small.

In the magnetic thin film with the above-mentioned structure in which $A_2$ contained in the intermediate layer is O, the intermediate layer has particularly high thermal stability. Therefore, for example, even in the case where a heat treatment temperature in a magnetic field required for fixing an antiferromagnetic film of a spin valve film in an operation environment of an HDD is relatively high, soft magnetic characteristics will not degrade.

According to still another aspect of the present invention, outstanding soft magnetic characteristics and high Bs can be obtained. This may be because soft magnetic characteristics are exhibited by a kind of refining effect of magnetic crystal grains.

The magnetic layer is composed of crystal grains containing a trace amount of amorphous material, and adjacent magnetic layers are not required to be completely separated by the intermediate layer. Even when crystal grains in the magnetic layers interposing the intermediate layer therebetween are observed to be partially continued crystallographycally, magnetic strength of crystal grains of in-plane portions of the film is different from that in a direction perpendicular to the film passing through the intermediate layer.

Therefore, even when the magnetic thin film is refined, for example, as a magnetic pole of a thin film head, outstanding soft magnetic characteristics can be exhibited at a high frequency without being influenced by shape anisotropy in a direction perpendicular to the film. Soft magnetic characteristics become particularly outstanding, when the intermediate layer is composed of amorphous material or microcrystal containing amorphous material. When the thickness of the magnetic layer is about 2 nm or less, magnetic characteristics degrade. When the thickness of the magnetic layer is about 20 nm or more, grains are likely to excessively grow. Furthermore, unless the thickness of the intermediate layer is about 0.4 nm or more, crystal grains cannot be effectively refined. Unless the thickness of the intermediate layer is about 2 nm or less, soft magnetic characteristics degrade. This may be because exchange binding between the magnetic layers is weakened. Furthermore, in terms of Bs, the ratio of film thickness is preferably $1 \leq T_1/T_2 \leq 50$.

According to still another aspect of the present invention, high Bs as well as outstanding soft magnetic characteristics at a high frequency can be obtained. This may be because of a kind of magnetostatic binding effect. The magnetic layer is composed of crystal grains or crystal grains containing a trace amount of amorphous material.

The magnetic layers are not required to be electrically insulated by the intermediate layer. When the thickness of the magnetic layer is about 20 nm or less, or larger than about 150 nm, magnetostatic binding becomes less effective. When the thickness of the intermediate layer is about 2 nm or less, the magnetic layers cannot be sufficiently separated, and exchange binding therebetween becomes strong. When the thickness of the intermediate layer exceeds about 15 nm, the distance between the magnetic layers becomes large, which results in that sufficient magnetostatic binding is unlikely to occur. If the shortest diameter of crystal grains included in the magnetic layer is about 20 nm or less which is sufficient for allowing a refining effect, in addition to magnetostatic binding, soft magnetic characteristics are further enhanced. The above-mentioned preferable thickness is considered to be determined in such a manner that the total of magnetostatic energy (which decreases due to magnetostatic binding of the magnetic thin film in a composition range of the present invention) and various energies (which are related to a domain structure resulting from a multi-layer structure). In terms of Bs, the ratio of film thickness is preferably $4 \leq T_1/T_2 \leq 50$.

According to still another aspect of the present invention, a high-resistant layer has an effect of suppressing an eddy current, and compositions of the magnetic layer, the intermediate layer, and the high-resistant layer are close to each other. Therefore, interface energy occurring on an interface between different kinds of layers can be suppressed. This will decrease magnetostriction multiplied by strain energy, caused by an internal stress occurring on the interface, and anisotropic energy in the film.

Consequently, a magnetic film having outstanding soft magnetic characteristics and high Bs can be obtained even in the case where the total thickness is relatively large. Furthermore, interface energy is relatively low. Therefore, it is not required to form a film at a high temperature for the purpose of removing strain energy during film formation or after film formation, or to conduct heat treatment for removing strain at a high temperature. This allows soft magnetic characteristics to be easily obtained by a process at a low temperature (about 300° C. or less).

Furthermore, in the case of using vapor deposition, depending upon the composition of the magnetic film of the present invention, one source for supplying a film formation material suffices. Therefore, high-speed film formation can be conducted with a simple apparatus and satisfactory mass-productivity. Furthermore, in the case where layers of different materials are formed, when materials with low interface energy are combined, inter-layer peeling is likely to be caused. However, according to the present invention, the element common to the magnetic layer and the intermediate layer functions as glue, so that the layered film of the present invention has high strength.

According to the present invention, a high-resistant layer of a magnetic multilayer with the above-mentioned structure is produced by forming a low-resistant layer containing at least one selected from the group consisting of Mg, Ca, Sr, Ba, Si, Al, Ti, and Cr in an amount of about 10% by atomic weight or more on a magnetic thin film or a magnetic layer, and oxidizing or nitriding the low-resistant layer in an atmosphere of oxygen/oxygen plasma or nitrogen/nitrogen plasma. Thus, a high-resistant layer with a relatively small thickness and outstanding insulation can be produced. The low-resistant layer may be formed of either of Si, Al, Ti, and Cr, or may be formed of an alloy film thereof. Even when the low-resistant layer is formed of an alloy with magnetic transition metal such as Fe, an excellent high-resistant layer can be produced, as long as at least one of Mg, Ca, Sr, Ba, Si, Al, Ti, and Cr is contained in an amount of about 10% by atomic weight or more. A relatively thin insulation layer has outstanding magnetostatic binding characteristics, so that both high soft magnetic characteristics and outstanding high frequency characteristics can be obtained.

Furthermore, in a thin film head having a structure in which at least an upper magnetic pole is composed of a high-resistant magnetic film or a magnetic multilayer with high resistivity, having a specific resistance of about 80 $\mu\Omega$cm or more and a magnetic thin film or a magnetic multilayer with the above-mentioned structure, and the magnetic thin film or the magnetic multilayer is formed at least in the vicinity of a recording gap at an end portion of the upper magnetic pole, outstanding overwrite characteristics are exhibited at a high frequency even at a relatively low recording current. This is because of the following: high Bs material of the present invention is used for the end portion of the recording gap of a recording head in the upper magnetic pole where a magnetic flux with its core width narrowed is likely to be saturated, and a high-resistant magnetic film or a magnetic multilayer with high resistivity having a small loss of an eddy current is used for another portion of the upper magnetic pole for inducing a magnetic flux into the end portion of the recording gap.

The high-resistant film may be a layered film of a high-resistant layer and a magnetic layer, or may be a high-resistant single film in which a grain boundary of microcrystal grains considered to be granular is substantially surrounded by high-resistant amorphous material. It is important that the high-resistant film is a soft magnetic film with a specific resistance of about 80 $\mu\Omega$cm or more. When the present invention is applied to a lower magnetic pole as well as the upper magnetic pole, a recording current can be further decreased.

Furthermore, a thin film head with the above-mentioned structure, in which a magnetic thin film or a magnetic multilayer with the above-mentioned structure is formed at least on a recording gap, and a high-resistant magnetic film or a magnetic multilayer with high resistivity having a specific resistance of about 80 $\mu\Omega$cm or more is formed on the magnetic thin film or the magnetic multilayer, exhibits outstanding overwrite characteristics at a relatively low recording current. Such a thin film head can be produced by a simple process. The high-resistant film herein should also be a soft magnetic film with a specific resistance of about 80 $\mu\Omega$cm or more.

According to still another aspect of the present invention, a thin film head having outstanding high-frequency characteristics can be produced. This is because of the following: high-resistant material having the composition and structure of the present invention can suppress an eddy current loss, so that recording ability at a high frequency can be remarkably improved. A specific resistance of about 80 $\mu\Omega$cm or more is caused by a high-resistant X-O or N compound formed in a magnetic crystal grain boundary.

Furthermore, it is important that O and N should be contained in a range required for forming an X-O or N compound, represented by the above-mentioned expression. Soft magnetic characteristics are caused by microcrystal grains having the shortest diameter of about 20 nm or less. The microcrystal grains have a structure close to a needle-shape or a grain-shape.

According to still another aspect of the present invention, a thin film head having outstanding high-frequency characteristics can be produced. The above-mentioned high-resistant thin film comprises microcrystals having the shortest diameter of about 20 nm or less or comprises microcrystal and amorphous material. Therefore, a number of crystal grain boundaries are formed, and as a result, crystal grains do not move smoothly because of domain walls, and a domain wall resonance loss is increased.

However, in a layered structure of the present invention, a domain wall structure is changed so that magnetostatic energy of the entire film is decreased; as a result, domain wall energy is decreased, and a domain wall resonance loss at a high frequency is decreased. Furthermore, in the case where, due to a leakage magnetic field from the high-resistant magnetic film, magnetostatic binding occurs in the high-resistant magnetic film and in the magnetic thin film or the magnetic multilayer included in the upper magnetic pole, magnetostatic energy over the entire thin film head is decreased and high-frequency characteristics are enhanced.

Furthermore, since the composition of the magnetic layer is close to that of the intermediate layer, interface energy occurring on an interface between different kinds of layers can be suppressed. This will decrease magnetostriction multiplied by strain energy, caused by an internal stress occurring on the interface, and anisotropic energy in the film. Furthermore, in the case of using vapor deposition, depending upon the composition of the high-resistant magnetic film of the present invention, one source for supplying a film formation material suffices. Therefore, high-speed film formation can be conducted with a simple apparatus and satisfactory mass-productivity.

Furthermore, according to the present invention, a magnetic thin film (or magnetic multilayer) and a high-resistant magnetic film (or magnetic multilayer with high resistivity) are formed by vapor deposition while a positional relationship between a substrate and a source for supplying film formation material is changed during film formation, and a magnetization difficult axis of a thin film is formed in the direction of relative movement between the substrate and the source. In this method, uniaxial magnetic anisotropy formed in the thin film is determined mainly by a growth direction of magnetic crystal grains included in the magnetic film and the diameter of a fine crystal grain. Therefore, for example, even in the case where a heat treatment for fixing an antiferromagnetic film of a spin valve film in an operation environment of an HDD is conducted while a magnetic field is applied in a direction orthogonal to a direction of a magnetization easy axis of the magnetic thin film (or the magnetic multilayer) and the high-resistant magnetic film (or the magnetic multilayer with high resistivity), anisotropy is unlikely to be disturbed.

According to a method for producing a thin film for a thin film head in which a direction of relative movement is in a depth direction of an upper magnetic pole of the thin film head, a magnetization difficult axis which is stable against heat treatment is formed in the depth direction of the upper magnetic pole, and the film quality on a slope surface of the upper magnetic pole is improved. Therefore, a thin film head having outstanding recording characteristics can be produced.

In a magnetic thin film (or magnetic multilayer), a high-resistant magnetic film (or magnetic multilayer with high resistivity), and a thin film head with the above-mentioned structure formed by using a vapor growth method for generating a magnetic field of about 50 Oe or more which is substantially orthogonal to the movement direction, substantially parallel to a film formation surface on the substrate, substantially uniform, and substantially in one direction, the intensity of uniaxial anisotropy of the magnetic thin film (or the magnetic multilayer) and the high-resistant magnetic film (or the magnetic multilayer) is averaged. Thus, high-frequency characteristics are stabilized over the entire thin film head.

According to still another aspect of the present invention, a magnetic layer and an intermediate layer of a magnetic thin film; a magnetic layer, an intermediate layer, and a high-resistant layer of a magnetic multilayer; and a magnetic layer and an intermediate layer of a high-resistant magnetic film or a magnetic multilayer with high resistivity can be produced by using the same source for supplying film formation material. Therefore, a vapor growth apparatus can be miniaturized, and films can be formed at a high speed.

Furthermore, according to a method for producing a magnetic thin film, a magnetic multilayer, a high-resistant magnetic film, a magnetic multilayer with high resistivity, and a thin film head with the above-mentioned structure in which a substrate temperature is substantially about 300° C. or less, even a very thin intermediate layer (which cannot be used at a high temperature of about 500° C.) can be used. Because of a relatively low production temperature (about 300° C. or less), such a very thin intermediate layer does not have its structure changed due to heat diffusion. The very thin intermediate layer allows the strongest magnetostatic binding between magnetic layers disposed via the intermediate layer, as long as the magnetic thin film is of a magnetostatic binding type with the above-mentioned structure. Also, a very thin high-resistant layer which does not allow Bs to decrease can easily be formed. With a high Bs composition (i.e., with a composition in which a metal magnetic element ratio is large), crystal grains are likely to grow by heat treatment. However, since a production temperature is relatively low, crystal grains can easily be maintained in a fine state, and a magnetic thin film or a magnetic multilayer using the above-mentioned refining effect can easily be realized. Because of this, high Bs, a high resistance, and outstanding high frequency characteristics are realized, and a thin film head with high corrosion resistance caused by microcrystal and/or amorphous material can be provided.

Furthermore, in an HDD using, at least for a magnetic pole or a part of a shield, a magnetic thin film, a magnetic multilayer, a high-resistant magnetic film, or a magnetic multilayer with high resistivity having the above-mentioned structure, and in an information processing apparatus using such an HDD, a high recording density can be realized at a frequency of about 100 MHz or more. Thus, an apparatus can be miniaturized and rendered light-weight.

Furthermore, in an HDD using a thin film head with the above-mentioned structure and in an information processing apparatus using such an HDD, in addition to miniaturization of an apparatus and rendering an apparatus light-weight due to a high recording density, a power consumption can be reduced due to a decreased recording current. As a result, a battery of a portable information processing apparatus provided with the HDD can be miniaturized, and such a portable apparatus can be used continuously for a longer period of time.

Thus, the invention described herein makes possible the advantages of providing a soft magnetic material with high BS having outstanding high frequency characteristics and a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 1 shows magnetic characteristics of a magnetic film of Example 1 according to the present invention.

FIG. 2 shows magnetic characteristics of a magnetic film of Example 1 according to the present invention.

FIG. 3 shows magnetic characteristics of a magnetic film of Example 1 according to the present invention.

FIG. 4 shows magnetic characteristics of a magnetic film of Example 1 according to the present invention.

FIG. 5 shows magnetic characteristics of a magnetic film of Example 1 according to the present invention.

FIG. 6 shows magnetic characteristics of a magnetic film of Example 2 according to the present invention.

FIG. 7 shows magnetic characteristics of a magnetic film of Example 2 according to the present invention.

FIG. 8 shows magnetic characteristics of a magnetic film of Example 3 according to the present invention.

FIG. 9 shows magnetic characteristics of a magnetic film of Example 3 according to the present invention.

FIG. 10 shows magnetic characteristics of a magnetic film of Example 4 according to the present invention.

FIG. 11 shows magnetic characteristics of a magnetic film of Example 4 according to the present invention.

FIG. 12 shows magnetic characteristics of a magnetic film of Example 4 according to the present invention.

FIG. 13 shows magnetic characteristics of a magnetic film of Example 4 according to the present invention.

FIG. 14 shows magnetic characteristics of a magnetic film of Example 4 according to the present invention.

FIG. 15 shows magnetic characteristics of a magnetic film of Example 4 according to the present invention.

FIG. 16 shows magnetic characteristics of a magnetic film of Example 5 according to the present invention.

FIG. 17 shows magnetic characteristics of a magnetic film of Example 5 according to the present invention.

FIG. 19A illustrates another method for producing a high-resistant layer of Example 5 according to the present invention.

FIG. 19B illustrates still another method for producing a high-resistant layer of Example 5 according to the present invention.

FIG. 19C illustrates still another method for producing a high-resistant layer of Example 5 according to the present invention.

FIG. 20 shows magnetic characteristics of a high-resistant magnetic film of Example 6 according to the present invention.

FIG. 21 shows magnetic characteristics of a high-resistant magnetic film of Example 6 according to the present invention.

FIG. 22 is a cross-sectional view of a conventional thin film head.

FIG. 23 is a schematic cross-sectional view of a thin film head using a magnetic film of Example 7 according to the present invention.

FIG. 31 shows a structure of a magnetron sputtering device used in the method for producing a thin film of example 7 according to the present invention.

FIG. 34 shows overwrite characteristics of a thin film head of Example 7 according to the present invention.

FIG. 37 shows magnetic characteristics of a thin film head of Example 8 according to the present invention.

DESCRIPTION OF THE PREFERRED EMBODIMENTS

Figure 18A:
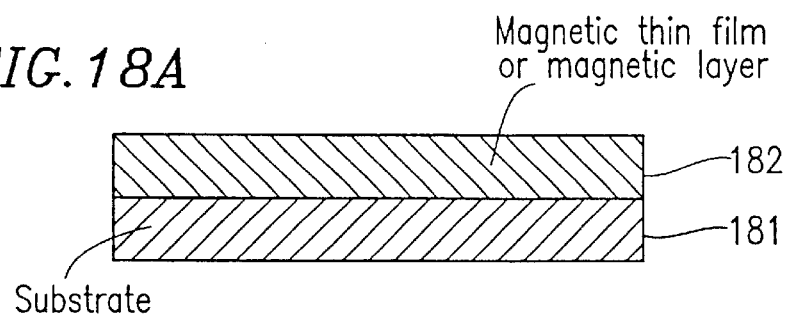
FIG. 18A illustrates a method for producing a high-resistant layer of Example 5 according to the present invention.

A magnetic film having the structure and composition according to the present invention is most preferably formed by vapor deposition under a low gas pressure. There is no particularly preferential procedure for vapor deposition. However, for example, a magnetic film can be formed by sputtering such as RF magnetron sputtering, DC sputtering, opposed target sputtering, and ion beam sputtering, or reactive vapor deposition in which reactive gas is introduced into the vicinity of a substrate, and material for vapor deposition is dissolved. The present invention is practiced by sputtering as follows. A magnetic film, a magnetic multilayer, or a high-resistant magnetic film is formed on a substrate by subjecting an alloy target to sputtering in an atmosphere of an inactive gas. In this case, the alloy target is determined for its composition, considering the compositions of a magnetic layer and an intermediate layer included in the magnetic film, a magnetic layer, an intermediate layer and a high-resistant layer included in the magnetic multilayer, or a high-resistant magnetic film after being formed. Alternatively, a pellet for adding elements is placed over a metal target; under this condition, the metal target is subject to sputtering. Alternatively, a part of an additive in a gas state is doped in an apparatus (reactive sputtering). Thus, each layer should be successively formed to a required thickness. An electrode for discharging may be at least one depending upon the composition.

Herein, by controlling a discharge gas pressure, a discharge power, a substrate temperature, a bias state of a substrate, a magnetic field on a target and in the vicinity of a substrate, a target shape, a direction in which particles are incident upon a substrate, and the kind of discharge gas, a structure of a magnetic film, a thermal expansion coefficient, film characteristics obtained by a relative position between a substrate and a target, etc. can be regulated.

EXAMPLES

In the following examples, a magnetic film is produced by RF magnetron sputtering or DC magnetron sputtering. A substrate temperature is in a range of room temperature to about 100° C. This is because of the natural increase in temperature caused by energy during formation of films. Practically, it is possible to produce a preferable magnetic film as long as a substrate temperature is about 250° C. or less. A film structure is observed by X-ray diffraction (XRD) or a transmission electron microscope (TEM). A composition is analyzed by electron probe micro analysis (EPMA), and a coercivity and a saturated magnetic flux density are evaluated by a BH loop tracer and a vibration sample magnetometer (VSM), respectively. The composition of each layer such as an intermediate layer and a magnetic layer in the examples is indicated in terms of that of a single layer (about 3 μm) obtained under the condition of producing each layer.

Hereinafter, the present invention will be described by way of illustrative examples.

Example 1

The present example shows the results obtained by examining thicknesses of a magnetic layer (FeSi) and an intermediate layer (FeSiO) included in a magnetic film.

The experimental conditions are as follows:
Substrate: non-magnetic ceramic substrate
Substrate temperature: room temperature to about 100° C.
Target of a magnetic film: FeSi alloy target
Target size: about 3 inches
Discharge gas pressure: about 8 mTorr
Discharge electric power: about 300 W
Sputtering gas: Ar for a magnetic layer
  Ar+$O_2$ for an intermediate layer (where an oxygen flow ratio $O_2/(Ar+O_2)$ is about 3% or about 25%)

The composition of a single layer obtained by using Ar alone in the present example is about $Fe_{94.0}Si_{6.0}$.

As shown in FIG. 1, it is preferable that Bs is about 1.5 T or more, and a coercivity is about 2.0 Oe or less. Depending upon the use, Bs may be less than about 1.5 T, or a coercivity may be larger than about 2.0 Oe.

FIGS. 1 through 4 show magnetic characteristics of FeSi/FeSiO magnetic films each obtained by using a FeSi alloy target in an atmosphere of Ar gas for a magnetic layer and Ar+$O_2$ (oxygen flow ratio is about 25%) for an intermediate layer, with varying thickness of the magnetic layer or the intermediate layer.

FIG. 5 shows the results obtained by changing the thickness of a magnetic layer in each FeSi/FeSiO magnetic film produced in an atmosphere of Ar+$O_2$ gas (oxygen flow ratio is about 3%) for an intermediate layer.

The cross-sections of films of Comparative Example ab and Example aa shown in FIG. 1 are observed with a TEM. In Comparative Example ab in which the intermediate layer is relatively thin, more than 50% magnetic crystal grains in a magnetic layer spread to an adjacent magnetic layer across an intermediate layer. In Example ba shown in FIG. 2 in which soft magnetic characteristics are satisfactory while the intermediate layer is relatively thin, many crystal grains in a magnetic layer spread to an adjacent magnetic layer across an intermediate layer. However, due to the small thickness ratio of the intermediate layer and the magnetic layer, soft magnetic characteristics over the entire film are more satisfactory than those in Comparative Example ab. As is understood from this, in a magnetic film including a relatively thick magnetic layer, it is important that at least 50% crystal grains spread across the intermediate layer, in addition to the small thickness ratio of the intermediate layer and the magnetic layer.

Any of the magnetic layers shown in FIGS. 1 to 4 contain crystal grains of about 10 nm or more, whereas any of the intermediate layers is amorphous or contains crystal grains of several nm.

In the present example, the magnetic film is subjected to pre-sputtering sufficiently during production of the magnetic layer and the intermediate layer. In addition to this, while the magnetic layer is formed by RF sputtering in an atmosphere of Ar gas, the intermediate layer is formed by intermittently introducing oxygen gas, whereby the magnetic layer and the intermediate layer are alternately formed continuously to obtain a magnetic thin film. It this case, it is found that about 1% to about 2% oxygen gas is added to the magnetic layer. The relationship in thickness between the intermediate layer and the magnetic layer in the magnetic thin film thus continuously produced is examined, which reveals that preferable soft magnetic characteristics can be obtained at the same thicknesses as those of the magnetic layer and the intermediate layer in the present example.

In the present example, FeSi and FeSiO are used for the magnetic layer and the intermediate layer, respectively. However, in the case where Fe contained in the magnetic layer or the intermediate layer is replaced by FeCo or FeCoNi, in the case where Si is replaced by at least one selected from the group consisting of Ge, Sn, Al, Ga, and transition metals (in particular, IVa group element, Va group element, or Cr), in the case where an appropriate amount or less of oxygen or nitrogen is added to the magnetic layer, or in the case where oxygen or nitrogen is appropriately added to the intermediate layer in an amount more than that in the magnetic layer, outstanding soft magnetic characteristics are obtained immediately after formation of the film to the completion of heat treatment (about 300° C.), with the same thicknesses of the magnetic layer and the intermediate layer as those in the present example.

In particular, regarding samples in which Si is replaced by Al, Ti, or V, high Bs as well as satisfactory soft magnetic characteristics are obtained. Furthermore, in the case where about 8% by atomic weight or less of Pt, Rh, or Ru is contained in elements excluding oxygen or nitrogen in the samples, corrosion resistance is enhanced.

The following is understood from the above-mentioned results.

Assuming that the average thickness of the magnetic layer is $T_1$ and the average thickness of the intermediate layer is $T_2$, the magnetic films satisfying the expressions below can have outstanding soft magnetic characteristics and high Bs.

2 nm$\leq T_1 \leq$150 nm
0.4 nm$\leq T_2 \leq$15 nm
$1 \leq T_1/T_2 \leq 150$

In particular, among these magnetic films, those which satisfy the expressions below and in which at least 50% magnetic crystal grains in the magnetic layers disposed via the intermediate layer spread across the intermediate layer have outstanding high-frequency characteristics and allow magnetostatic binding to effectively occur.

20 nm<$T_1 \leq$150 nm
1 nm<$T_2 \leq$15 nm
$4 \leq T_1/T_2 \leq 50$

Example 2

The present example shows the results obtained by examining the added amounts of Si, O, and N in a magnetic layer of a magnetic film. The magnetic film of the present example includes a magnetic layer (FeSi(O)(N)) and an intermediate layer (FeSiO).

The experimental conditions are as follows:
Substrate: non-magnetic ceramic substrate
Substrate temperature: room temperature to about 100° C.
Target of a magnetic film: Fe or FeSi alloy target
Target size: about 3 inches
Discharge gas pressure: about 8 mTorr
Discharge electric power: about 300 W
Sputtering gas: Ar+($O_2$)+($N_2$) for a magnetic layer
  Ar+$O_2$+($N_2$) for an intermediate layer As shown in FIG. 6, it is preferable that Bs is about 1.5 T or more, and a coercivity is about 2.5 Oe or less. Depending upon the use, Bs may be less than 1.5 T, or a coercivity may be larger than about 2.5 Oe.

FIG. 6 shows magnetic characteristics of Fe/FeO or FeSi/FeSiO magnetic films each obtained by using a Fe or FeSi alloy target. Herein, the magnetic layer is obtained by sputtering in an atmosphere of Ar gas and the intermediate layer is obtained by sputtering, using the same target as that in the magnetic layer, in an atmosphere of Ar+$O_2$ gas (oxygen flow ratio is about 25%). The thicknesses of the FeSi magnetic layer and the FeSiO intermediate layer are fixed to about 70 nm and about 5 nm, respectively.

FIG. 7 shows the results of FeSi(O)(N)/FeSiO magnetic films produced by varying the added amounts of oxygen and nitrogen in the magnetic layer. Herein, the magnetic layer is obtained by sputtering in an atmosphere of Ar+($O_2$)+($N_2$) gas and the intermediate layer is obtained by sputtering, using the same target as that in the magnetic layer, in an atmosphere of Ar+$O_2$+($N_2$) gas (oxygen flow ratio is about 25%). The thicknesses of the FeSi magnetic layer and the FeSiO intermediate layer are fixed to about 100 nm and about 7 nm, respectively.

The above-mentioned values are all immediately after formation of the films. Any of the magnetic films of the present example show satisfactory soft magnetic characteristics even after heat treatment at about 300° C. It is understood from Comparative Example fa and Example fa shown in FIG. 6 that the addition of at least about 0.1% by atomic weight of Si will substantially enhance soft magnetic characteristics. Furthermore, it is understood from Examples and Comparative Examples shown in FIG. 7 that in the case where the added amount of Si is relatively small, the content of oxygen or nitrogen is preferably about 10% by atomic weight or less.

In the present example, FeSi(O)(N) and FeSiO are used for the magnetic layer and the intermediate layer, respectively. However, in the case where Fe in the magnetic layer or the intermediate layer is replaced by FeCo and FeCoNi, or in the case where Si is replaced by at least one of Ge, Sn, Al, Ga, and transition metals (in particular, IVa group element, Va group element, or Cr), outstanding soft magnetic characteristics are obtained immediately after formation of the film to the completion of heat treatment (about 300° C.), as long as the content of oxygen or nitrogen in the magnetic layer is in a preferable range of the present example, and the composition of metal or semi-metal added to magnetic metal is in a preferable range of the present example.

In particular, regarding samples in which Si is replaced by Al, Ti, or V, high Bs as well as satisfactory soft magnetic characteristics are obtained. Furthermore, in the case where about 8% by atomic weight or less of Pt, Rh, or Ru is contained in elements excluding oxygen or nitrogen in the samples, corrosion resistance is enhanced.

In summary, if the composition of the magnetic layer is expressed by $(M_1\alpha_1X_1\beta_1)_{100-\delta_1}A_1\delta_1$ (where $\alpha_1$, $\beta_1$, and $\delta_1$ represent % by atomic weight; $M_1$ is at least one magnetic metal selected from the group consisting of Fe, Co, and Ni; $X_1$ is at least one selected from the group consisting of Si, Ge, Sn, Al, Ga, and transition metals excluding $M_1$; $A_1$ is at least one selected from the group consisting of O and N), the composition is in a range represented as follows:

$0.1 \leq \beta_1 \leq 12$ $\alpha_1 + \beta_1 = 100$ $0 \leq \delta_1 \leq 10$

Example 3

The present example shows the results obtained by varying the kind of intermediate layer.

FIG. 8 shows the compositions of intermediate layers, and soft magnetic characteristics of magnetic thin film produced by using the intermediate layers.

Herein, each magnetic layer is produced by sputtering in an atmosphere of Ar gas, and each intermediate layer is produced by sputtering, using the same target as that in the magnetic layer, in an atmosphere of Ar+($O_2$)+($N_2$) gas. The composition of a FeSi magnetic layer is $Fe_{96.5}Si_{3.5}$, and has a thickness of about 10 nm. The thickness of each intermediate layer is fixed to about 2 nm.

The values shown in FIG. 8 are obtained by conducting heat treatment at about 250° C. in a vacuum. The intermediate layers containing oxygen or nitrogen have a large Si/Fe ratio. As is understood by comparing Example ha or hd with Comparative Example ha, soft magnetic characteristics are enhanced even by the addition of a trace amount of O or N. In Comparative Example hb, soft magnetic characteristics are not so unsatisfactory; however, surface roughness is caused after heat treatment. More specifically, it is found that the amount of oxygen or nitrogen contained in an intermediate layer should be more than that in a magnetic layer and 67% or less.

FIG. 9 shows the composition of each intermediate layer produced by using a target different from that in a magnetic layer, and soft magnetic characteristics of magnetic thin films obtained by using the intermediate layers. Each magnetic layer is produced by sputtering in an atmosphere of Ar gas. The composition of FeSi magnetic layer is $Fe_{96.5}Si_{3.5}$, and has a thickness of about 100 nm. Each intermediate layer is produced by sputtering in an atmosphere of Ar+($O_2$)+($N_2$) gas so as to have each composition shown in FIG. 9. The thickness of each intermediate layer is fixed to about 5 nm. FIG. 9 also shows a processing speed when each intermediate layer is etched by sputtering in an atmosphere of Ar gas at about 400 W and about 5 mTorr.

FIG. 9 shows the results obtained by conducting heat treatment at 250° C. in a vacuum after formation of the films. As is understood by comparing Examples with Comparative Examples, when the amount of Ti, Cr, V, Si, or Al with respect to Fe is increased, soft magnetic characteristics slightly degrade, and the processing speed of the intermediate layer is largely decreased. More specifically, when Ti, Cr, V, Si, or Al is added in an amount more than 4 times that of Fe, soft magnetic characteristics degrade and a processing speed is decreased.

In the present example shown in FIGS. 8 and 9, FeSi is used for the magnetic layer, and FeSi(O) (N) is used for the intermediate layer. However, even in the case where Fe in the intermediate layer is replaced by FeCo or FeCoNi, or even in the case where Si is replaced by at least one selected from the group consisting of Mg, Ca, Sr, Ba, Ge, Sn, Al, Ga, and transition metals (in particular, a IVa group, a Va group, or Cr) under the condition that the magnetic layer is in a preferable composition range as shown in Example 2, outstanding soft magnetic characteristics are obtained immediately after formation of a film to the completion of heat treatment at about 300° C., and an outstanding processing speed is obtained. In this case, it is required that the content of oxygen or nitrogen in the intermediate layer is in the same range as that in the present example, or the added amount of metal and semi-metal in the intermediate layer is 4 times or less that of magnetic metal.

In summary, if the composition of the intermediate layer of the magnetic thin film of the present invention is expressed by $(M_2\alpha_2X_2\beta_2)_{100-\delta_2}A_2\delta_2$ (where $\alpha_2$, $\beta_2$, and $\delta_2$ represent % by atomic weight; $M_2$ is at least one magnetic metal selected from the group consisting of Fe, Co, and Ni; $X_2$ is at least one selected from the group consisting of Si, Ge, Sn, Al, Ga, and transition metals excluding $M_1$; $A_2$ is at least one selected from the group consisting of O and N), the composition is in a range represented as follows:

$0.1 \leq \beta_2 \leq 80$ $\alpha_2 + \beta_2 = 100$ $\delta_1 \leq \delta_2 \leq 67$

Example 4

The present example shows the results obtained by examining the added elements contained in a magnetic layer.

The experimental conditions are as follows:

Substrate: non-magnetic ceramic substrate

Substrate temperature: room temperature to about 100° C.

Target of a magnetic film: complex target in which an element chip with metal or semi-metal shown in FIGS. 10 to 15 added thereto is placed on a Fe target. The same target is used for a magnetic layer and an intermediate layer.

Discharge gas pressure: about 8 mTorr

Discharge electric power: about 300 W

Sputtering gas: $Ar+(O_2)+(N_2)$ for a magnetic layer

Oxygen flow ratio $O_2/(Ar+O_2)$ is about 0% to about 1.5%

Nitrogen flow ratio $N_2/(Ar+N_2)$ is about 0% to about 5% (only magnetic layers with nitrogen added thereto)

$Ar+O_2+(N_2)$ for an intermediate layer

Oxygen flow ratio $O_2/(Ar+O_2)$ is fixed to be about 20%

Nitrogen flow ratio $N_2/(Ar+N_2)$ is about 0% to about 5% (only magnetic layers with nitrogen added thereto)

Sputtering gases with the above-mentioned flow ratios are alternately switched during formation of a film.

FIGS. 10 through 15 show soft magnetic characteristics of magnetic thin films and compositions of magnetic layers included in the magnetic thin films. A Fe single layer is listed as Comparative Example ja. The thickness of each magnetic layer is about 70 nm, and the thickness of each intermediate layer is about 5 nm. In the present example, it is confirmed, from Auger depth profile results obtained by continuously forming a magnetic layer and a non-magnetic layer while switching reactive gases during sputtering using the same target, that magnetic elements and added elements contained in the magnetic layer are added to the intermediate layer, and oxygen is added to the intermediate layer in an amount equal to or more than that in the magnetic layer. However, an exact composition of the intermediate layer is unclear.

Switching of reactive gases includes switching of power supplies to a plasma generation source, switching of a mixed ratio of argon inactive gas, switching of a discharge gas pressure during sputtering, switching of a sputtering power, and switching of a gas flow ratio.

The amount of elements of each magnetic layer shown in FIGS. 10 through 15 corresponds to that of a single layer (about 3 μm) formed under the condition of producing a magnetic layer. Actually, continuously formed magnetic layers are highly likely to contain an excess amount of oxygen of about 0% to about 3% by atomic weight due to the influence, for example, residual oxygen in the course of production of an intermediate layer.

By adding the additives as shown in FIGS. 10 through 15 and varying the amount of oxygen or nitrogen, a magnetic thin film having soft magnetic characteristics more outstanding than those of a Fe single layer can be obtained.

In the present example, the magnetic thin films which mainly contain Fe are examined. However, even in the case where Fe is replaced by FeCo or FeCoNi, outstanding soft magnetic characteristics are obtained immediately after formation of a film to the completion of heat treatment at about 300° C.

In summary, assuming that the composition of the intermediate layer of the magnetic thin film of the present invention is expressed by $(M_2\alpha_2X_2\beta_2)_{100-\delta_2}A_2\delta_2$ (where $\alpha_2$, $\beta_2$, and $\delta_2$ represent % by atomic weight; $M_2$ is at least one magnetic metal selected from the group consisting of Fe, Co, and Ni; $X_2$ is at least one selected from the group consisting of Mg, Ca, Sr, Ba, Si, Ge, Sn, Al, Ga, and transition metals excluding $M_1$; $A_2$ is at least one selected from the group consisting of O and N), when the composition is in a range represented as follows and $M_1=M_2$ and $X_1=X_2$:

$0.1 \leq \beta_2 \leq 80$ $\alpha_2 + \beta_2 = 100$ $\delta_1 \leq \delta_2 \leq 67$ outstanding soft magnetic characteristics are obtained.

Furthermore, according to the method for producing a magnetic thin film of the above-mentioned structure by changing the concentration of oxygen/oxygen plasma or nitrogen/nitrogen plasma in a vapor growth apparatus as in the present example, a magnetic layer and an intermediate layer of a magnetic thin film, a magnetic layer, an intermediate layer and a high-resistant layer of a magnetic multilayer, and a magnetic layer and an intermediate layer of a high-resistant magnetic film can be produced by using the same source for supplying film formation material. This allows miniaturization of a growth apparatus and high-speed formation of a film.

Example 5

In the present example, a magnetic thin film and a high-resistant layer are formed on top of the other. The results obtained by examining the composition and thickness of a high-resistant layer in a magnetic multilayer will be shown.

First, a magnetic layer, an intermediate layer, and a high-resistant layer are examined in the case of using the same target.

The experimental conditions are as follows:

Substrate: non-magnetic ceramic substrate

Substrate temperature: room temperature to about 100° C.

Target of a magnetic multilayer: FeSiAl alloy target for a magnetic layer, an intermediate layer, and a high-resistant layer Discharge gas pressure: about 8 mTorr Discharge electric power: about 300 W Sputtering gas: Ar for a magnetic layer $Ar+O_2$ for an intermediate layer (where an oxygen flow ratio $O_2/(Ar+O_2)$ is about 20%)

$Ar+O_2$ for a high-resistant layer (where an oxygen flow ratio $O_2/(Ar+O_2)$ is about 20%), formed in a uniaxial magnetic field of about 100 Oe The composition of a single layer produced in an atmosphere of Ar alone in the present example is about $Fe_{96.5}Si_{3.0}Al_{0.5}$.

FIG. 16 shows soft magnetic characteristics obtained by changing the thickness of a magnetic thin film and the thickness of a high-resistant layer under the condition that the thickness of a magnetic layer is about 48.5 nm and the thickness of an intermediate layer is about 1.5 nm. The total thickness of each magnetic multilayer is about 4 μm.

In Examples shown in FIG. 16, each magnetic multilayer has a magnetic permeability of about 500 or more at about 100 MHz and about 400 or more at about 300 MHz, and has Bs of about 1.7 T or more. Each magnetic multilayer is provided with uniaxial anisotropy of about 5 Oe. In Examples qa through qd, it is considered that insulation is substantially eliminated in an intermediate layer of about 10 nm. On the other hand, in Comparative Example qd, it is considered that insulation between magnetic layers is not eliminated in an intermediate layer of about 1.5 nm due to the frequency dependence of magnetic permeability. Furthermore, in Comparative Examples qb and qc, it is easily understood that a high-resistant layer of about 50 nm sufficiently functions for insulation; however, sufficient magnetostatic binding does not occur in the magnetic thin film including a thick high-resistant layer, so that soft magnetic characteristics are poor and Bs is low.

Next, a magnetic multilayer is examined, in which a high-resistant layer is produced by using an Al or Si target under the condition that the same magnetic layer and intermediate layer as those described above are used.

The experimental conditions are the same as those in the above except for the conditions of producing a high-resistant layer. Only the differences will be shown below.

Comparative Example ra
Target: FeSiAl alloy target for a magnetic layer, an intermediate layer, and a high-resistant layer Example ra
Target: FeSiAl alloy target for a magnetic layer and an intermediate layer
Al for a high-resistant layer Example rb
Target: FeSiAl alloy target for a magnetic layer and an intermediate layer
Si for a high-resistant layer Example rc
Target: FeSiAl alloy target for a magnetic layer and an intermediate layer
FeSiAl alloy target and Al target are simultaneously discharged for a high-resistant layer
Sputtering gas:
High-resistant layer of Comparative Example ra: Ar+$O_2$ (where an oxygen flow ratio $O_2/(Ar+O_2)$ is about 20%)
High-resistant layer of Example ra: an Al layer (low-resistant layer) is oxidized in an atmosphere of oxygen plasma
High-resistant layer of Example rb: a Si layer (low-resistant layer) is oxidized in an atmosphere of oxygen plasma
High-resistant layer of Example rc: a $Fe_{90}Si_3Al_7$ layer (low-resistant layer) produced by simultaneous discharge is oxidized in an atmosphere of oxygen plasma The above-mentioned high-resistant layers are formed in a uniform magnetic field of about 100 Oe.

FIG. 17 shows soft magnetic characteristics depending upon the kind of a high-resistant layer under the conditions that the thickness of a magnetic layer is about 48.5 nm, the thickness of an intermediate layer is about 1.5 nm, the thickness of a magnetic thin film is about 500 nm, and the total thickness of a magnetic multilayer is about 4 $\mu$m.

Any film shown in FIG. 17 is provided with uniaxial anisotropy of about 13 to about 14 Oe. In Comparative Example ra, a high-resistant layer is produced by introducing oxygen during formation of a film; however, the high-resistant film does not sufficiently insulate magnetic thin films due to the frequency characteristics of magnetic permeability. This may be caused by the following: the high-resistant film does not have sufficiently high resistance as being an oxide film mainly containing Fe. Furthermore, in any of the magnetic multilayer of Examples shown in FIG. 17, the high-resistant layer insulates magnetic thin films, and a magnetic permeability is increased. This may be because an electrostatic binding effect is exhibited due to small thickness of the high-resistant layer. Soft magnetic characteristics of Example rc are more outstanding than those of Examples ra and rb.

In summary, assuming that magnetic thin films and a high-resistant layer are alternately formed, and the thickness of the magnetic thin film is $T_3$ and the thickness of the high-resistant layer is $T_4$, a magnetic multilayer which satisfies the following conditions will have outstanding high-frequency characteristics and high Bs.

100 nm $\leq T_3 \leq$ 1000 nm
2 nm $\leq T_4 \leq$ 50 nm
10 $\leq T_3/T_4 \leq$ 500

In the magnetic multilayer, assuming that the magnetic layer, the intermediate layer, and the high-resistant layer have compositions represented by $M_1X_1A_1$, $M_2X_2A_2$, and $M_3X_3A_3$, respectively ($M_1$, $M_2$, and $M_3$ are at least one magnetic metal selected from the group consisting of Fe, Co, and Ni; $X_1$, $X_2$, and $X_3$ are at least one selected from the group consisting of Mg, Ca, Sr, Ba, Si, Ge, Sn, Al, Ga, and transition metals excluding the magnetic metal; $A_1$ to $A_3$ represent at least one selected from the group consisting of O and N), when the conditions: $M_1=M_2=M_3$ and $X_1=X_2=X_3$ are satisfied, outstanding soft magnetic characteristics and high Bs can be obtained even in the case where the total film thickness is relatively large.

According to a method for producing a high-resistant layer of the magnetic multilayer with the above-mentioned structure, including the steps of: forming a low-resistant layer containing at least one selected from the group consisting of Mg, Ca, Sr, Ba, Si, Ge, Sn, Al, and Ga in an amount of about 10% by atomic weight or more on a magnetic thin film or a magnetic layer; and oxidizing or nitriding the low-resistant layer in an atmosphere of oxygen/oxygen plasma or nitrogen/nitrogen plasma, a high-resistant layer which is relatively thin and has outstanding insulation characteristics can be produced. The low-resistant layer may be made of one of Mg, Ca, Sr, Ba, Si, Ge, Sn, Al and Ga, or may be an alloy layer thereof. For example, the low-resistant layer may be made of Al, Si, an AlTi alloy, or a $Fe_{90}Si_{10}$ alloy. Particularly, an element selected from the group consisting of Si, Al, Ti, and Cr is likley to be dissolved in a solid state with magnetic metal. Thus, such an element is preferable in the case where the low-resistant layer is made of a magnetic alloy.

Figure 18B:
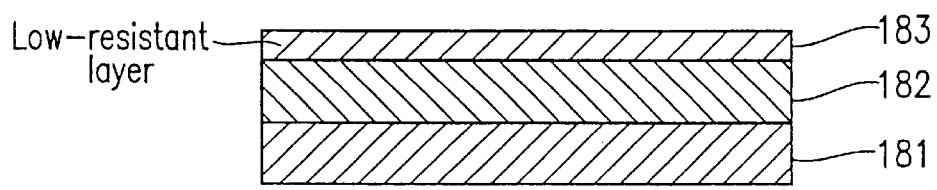
FIG. 18B illustrates a method for producing a high-resistant layer of Example 5 according to the present invention.
Figure 18C:
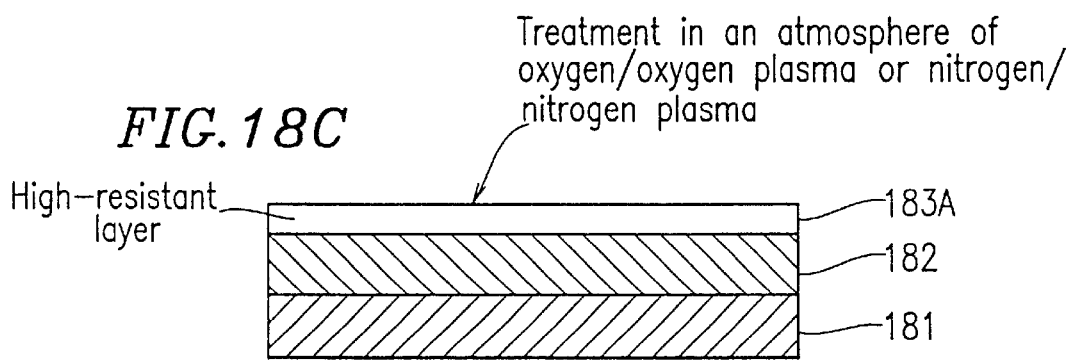
FIG. 18C illustrates a method for producing a high-resistant layer of Example 5 according to the present invention.
Figure 18D:
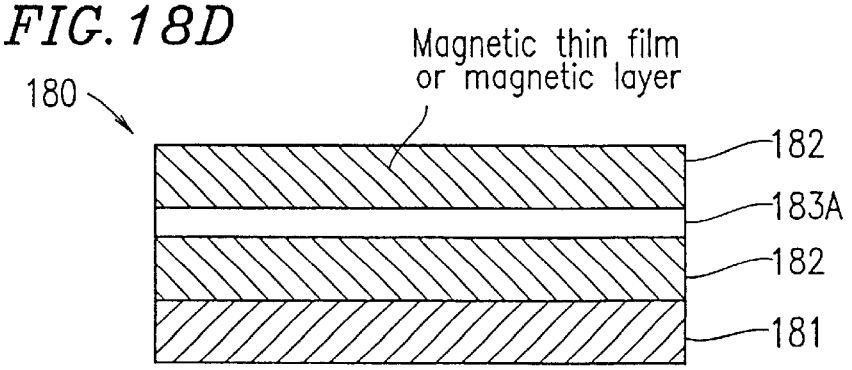
FIG. 18D illustrates a method for producing a high-resistant layer of Example 5 according to the present invention.
Figure 18E:
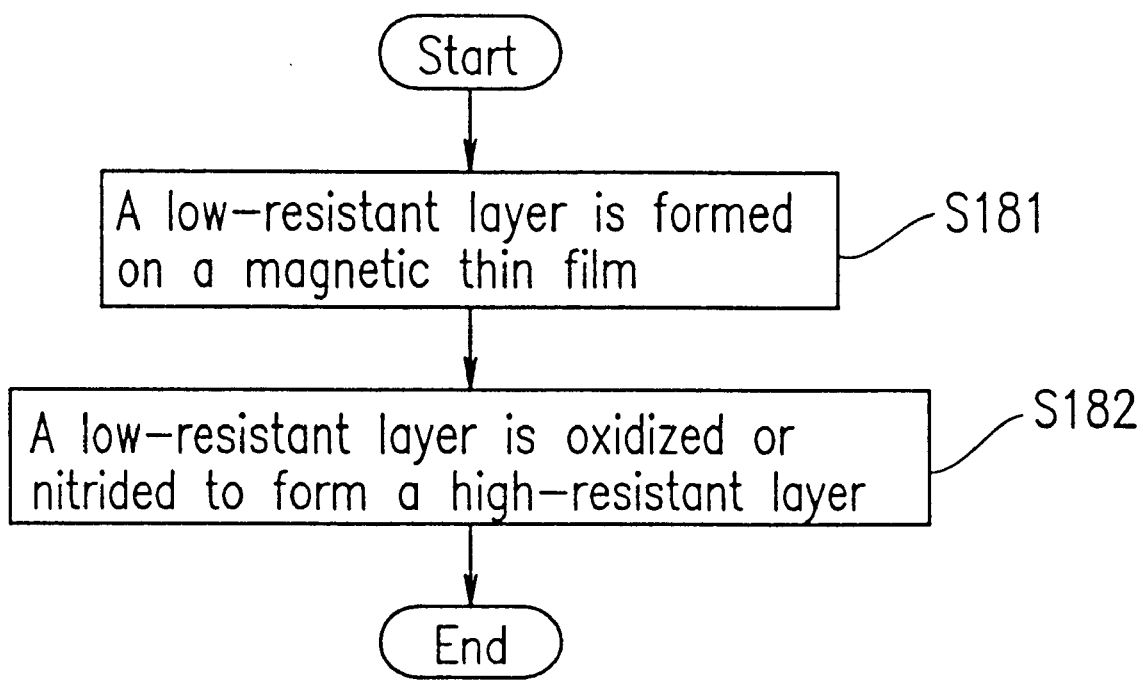
FIG. 18E is a flow chart of a method for producing a high-resistant layer of Example 5 according to the present invention.

Referring to FIGS. 18A through 18E and FIGS. 19A through 19C, a method for producing a high-resistant layer will be described. FIGS. 18A through 18D illustrate a method for producing a high-resistant layer. FIG. 18E is a flow chart illustrating a method for producing a high-resistant layer. FIGS. 19A through 19C illustrate another method for producing a high-resistant layer.

Referring to FIGS. 18A through 18E, a magnetic thin film 182 is formed on a substrate 181 (FIG. 18A). A low-resistant layer 183 containing at least one of Mg, Ca, Sr, Ba, Si, Ge, Sn, Al, Ga, and transition metals excluding the above-mentioned $M_1$ in an amount of about 10% by atomic weight is formed on the magnetic thin film 182 (FIG. 18B, Step S181 in FIG. 18E).

The low-resistant layer 183 is oxidized or nitrided in an atmosphere of oxygen, nitrogen, oxygen plasma, and nitrogen plasma, whereby a high-resistant layer 183A is formed (FIG. 18C, Step S182 in FIG. 18E).

The magnetic thin film 182 may be a magnetic layer. The magnetic thin film 182 and the high-resistant layer 183A may be multi-layered by repeatedly, alternately forming the magnetic thin film 182 and the high-resistant layer 183A on the high-resistant layer 183A (FIG. 18D).

Referring to FIGS. 19A through 19C, another method for producing a high-resistant layer will be described. The magnetic thin film or the magnetic layer may contain oxygen-compatible elements. A magnetic thin film 192 containing an oxygen-compatible element such as Si, Al, Ti, and Cr is formed on a substrate 191 (FIG. 19A). A low-resistant layer 193 containing at least one selected from the group consisting of Mg, Ca, Sr, Ba, Si, Ge, Sn, Al, Ga, and transition metals excluding the above-mentioned $M_1$ in an amount of about 10% by atomic weight or more is formed on the magnetic thin film 192.

The low-resistant layer 193 is oxidized or nitrided in an atmosphere of oxygen/oxygen plasma and nitrogen/nitrogen plasma, whereby a high-resistant layer 193A is formed (FIG. 19B).

The magnetic thin film 192 may be a magnetic layer. The magnetic thin film 192 and the high-resistant layer 193 may be multi-layered by repeatedly, alternately forming the magnetic thin film 192 and the high-resistant layer 193 on the high-resistant layer 193 (FIG. 19C).

Example 6

The present example shows the results obtained by examining the composition of a high-resistant magnetic film with a resistivity of about 80 $\mu\Omega$cm or more and a magnetic multilayer with high resistivity obtained by layering high-resistant magnetic films.

The experimental conditions are as follows:

Substrate: non-magnetic ceramic substrate

Substrate temperature: room temperature to about 100° C.

Target: complex target in which a metal, semi-metal, or oxide chip is disposed on a Fe or FeCo target. The same target is used for a magnetic layer and an intermediate layer.

Discharge gas pressure: about 8 mTorr

Discharge electric power: about 300 W

Sputtering gas:

High-resistant magnetic film
Ar+($O_2$)+($N_2$) (where oxygen flow ratio $O_2$/(Ar+$O_2$) is about 0% to about 5%, and nitrogen flow ratio $N_2$/(Ar+$N_2$) is about 20% (only high-resistant magnetic films with nitrogen added thereto)), formed in a uniform magnetic field of about 100 Oe High-resistant magnetic multilayer
Magnetic layer: Ar+($O_2$)+($N_2$) (where oxygen flow ratio $O_2$/(Ar+$O_2$) is about 0% to about 5%, and nitrogen flow ratio $N_2$/(Ar+$N_2$) is about 20% (only high-resistant magnetic films with nitrogen added thereto)), formed in a uniform magnetic field of about 100 Oe Intermediate layer: Ar+$O_2$ (where oxygen flow ratio $O_2$/(Ar+$O_2$) is fixed to be about 20%), formed in no magnetic field Sputtering gases with the above-mentioned flow ratios are alternately switched during formation of a film.

FIG. 20 shows soft magnetic characteristics and compositions of high-resistant magnetic films after heat treatment at about 250° C. in a vacuum. The thickness of each high-resistant magnetic film is about 4 $\mu$m.

The high-resistant magnetic films of Examples shown in FIG. 20 exhibit a high resistance of about 80 $\mu\Omega$cm or more, although a resistivity is slightly decreased after heat treatment, compared with the case immediately after formation of the films. As is understood from the Examples shown in FIG. 20, when the high-resistant magnetic film is represented by M $\alpha$ X $\beta$ (N $\delta$ O$\epsilon$) $\gamma$ (where $\alpha$, $\beta$, $\gamma$, $\delta$, and $\epsilon$ represent % by atomic weight; M is at least one magnetic metal selected from the group consisting of Fe, Co, and Ni; and X is at least one selected from the group consisting of Mg, Ca, Sr, Ba, Si, Ge, Sn, Al, Ga, and transition metals excluding the above-mentioned M), assuming that a chemical formula when X becomes a nitride having the lowest nitride generation free energy and a chemical formula when X becomes a nitride having the lowest oxide generation free energy, it is important that the following range should be satisfied:

$\alpha+\beta+\gamma=100$ $45 \leq \alpha \leq 78$ $\delta+\epsilon=100$ $1 < 100 \times \gamma/\beta/(m \times \delta + n \times \epsilon) < 2.5$ Furthermore, the shortest diameter of an average crystal grain is about 20 nm or less.

Next, high-resistant magnetic films are used as magnetic layers, and intermediate layers are produced by using the same target as that of each high-resistant magnetic film with an oxygen flow ratio of about 20%. The magnetic layers each having a thickness of about 500 nm and the intermediate layers each having a thickness of about 500 nm are alternately formed to obtain magnetic multilayers. The magnetic multilayer with high resistivity is formed into strips with a width of about 1 $\mu$m and a length of about 1 mm by a focused ion beam (FIB), and the strips are measured for magnetic permeability at a high-frequency. Furthermore, as Comparative Examples, a high-resistant magnetic film is formed into the same shape as that of the magnetic multilayer, in which the thickness of each magnetic layer is about 100 nm and the thickness of each intermediate layer is about 5 nm. FIG. 21 shows soft magnetic characteristics obtained after heat treatment at about 250° C.

As is understood from the results shown in FIG. 21, a high-resistant magnetic film formed into a relatively minute shape exhibits an increased magnetic permeability at a high frequency by being layered on an intermediate layer having a higher oxygen concentration, and such a layered structure is effective for a magnetic device subjected to minute processing such as a thin film head.

As described above, a thin film head having more outstanding high-frequency characteristics can be produced by using a magnetic multilayer with high resistivity having a structure in which magnetic layers and intermediate layers are alternately formed. Each magnetic layer is made of a high-resistant magnetic film with the above-mentioned structure and has a composition represented by $M_{1m1}X_{1n1}A_{1q1}$, and each intermediate layer has a composition represented by $M_{2m2}X_{2n2}A_{2q2}$ (where m1, n1, q1, m2, n2, and q2 represent % by atomic weight; $M_1$ and $M_2$ are at least one magnetic metal selected from the group consisting of Fe, Co, and Ni; $X_1$ and $X_2$ are at least one selected from the group consisting of Mg, Ca, Sr, Ba, Si, Ge, Sn, Al, Ga, and transition metals excluding the magnetic metal; and $A_1$ and $A_2$ are at least one selected from the group consisting of O and N); the following expressions are satisfied:

$M_1=M_2$, $X_1=X_2$ $q1<q2$

In the present example, sputtering is used; however, the above-mentioned films can be produced by using reactive vapor deposition.

Example 7

The present example shows recording characteristics obtained by applying a magnetic thin film of the present invention to a recording magnetic pole of a thin film head.

The structure of a thin film head used in the present example is as follows:

Recording medium: about 2200 Oe

Recording gap: about 0.2 $\mu$m

Recording frequency: about 100 MHz

Number of turns: about 42

Thicknesses of upper and lower magnetic poles: about 4 $\mu$m each

Recording current: fixed to be about 5 mA

Permalloy (NiFe) deposited by plating is used for films of Comparative Examples. Each magnetic thin film of Examples includes the following layers: magnetic layers $Fe_{94.0}Si_{6.0}$ (about 100 nm per layer) and intermediate layers: $(Fe_{0.93}Si_{0.7})_xO_{100-X}$ (about 5 nm per layer), and each magnetic multilayer with high resistivity includes the following layers: magnetic layers $Fe_{69}Mg_{13}O_{18}$ (about 100 nm per layer) and intermediate layers $(Fe0.84Mg0.16)_xO_{100-X}$ (about 5 nm per layer) where 18<X.

Referring to FIGS. 22 to 30, a thin film head of the present example will be described. In the drawings, a magnetic thin film is represented by high Bs, and a magnetic multilayer are represented by high $\rho$.

FIG. 22 shows a structure of a thin film head 220 of Comparative Example ua (see FIG. 34). The thin film head 220 includes an upper magnetic pole 221, a lower magnetic pole 222, a shield film 223, and a coil 224. The upper magnetic pole 221, the lower magnetic pole 222, and the shield film 223 contain $Ni_{50}Fe_{50}$.

FIG. 23 shows a structure of a thin film head 230 of Example ua (see FIG. 34). The thin film head 230 includes an upper magnetic pole 231, a lower magnetic pole 232, a shield film 233, and a coil 234. The upper magnetic pole 231, the lower magnetic pole 232, and the shield film 233 respectively contain a magnetic thin film.

Figure 24:
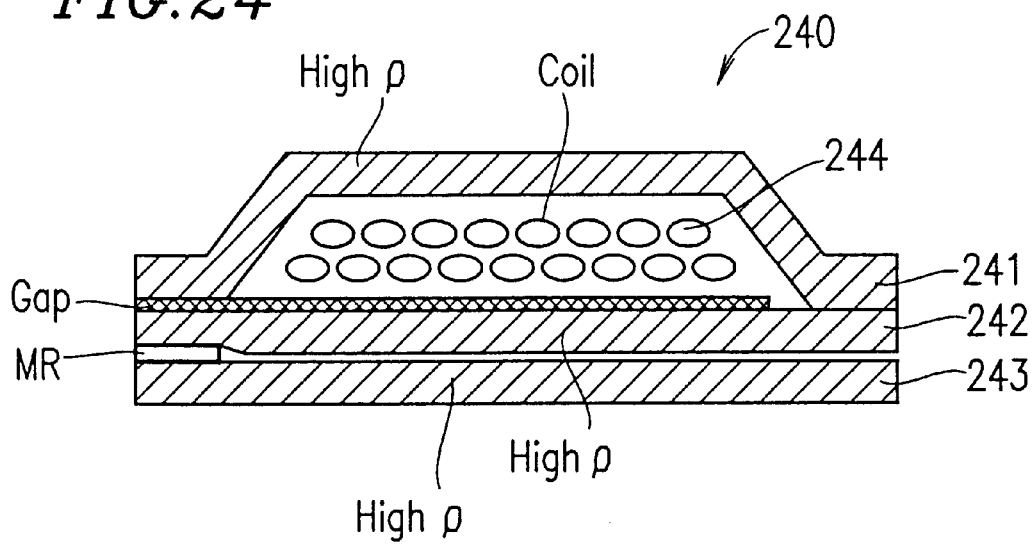
FIG. 24 is a schematic cross-sectional view of a thin film head using a magnetic multilayer with high resistivity of Example 7 according to the present invention.

FIG. 24 shows a structure of a thin film head 240 of Example ub (see FIG. 34). The thin film head 240 includes an upper magnetic pole 241, a lower magnetic pole 242, a shield thin film 243, and a coil 244. The upper magnetic pole 241, the lower magnetic pole 242, and the shield film 243 respectively contain a magnetic multilayer.

Figure 25:
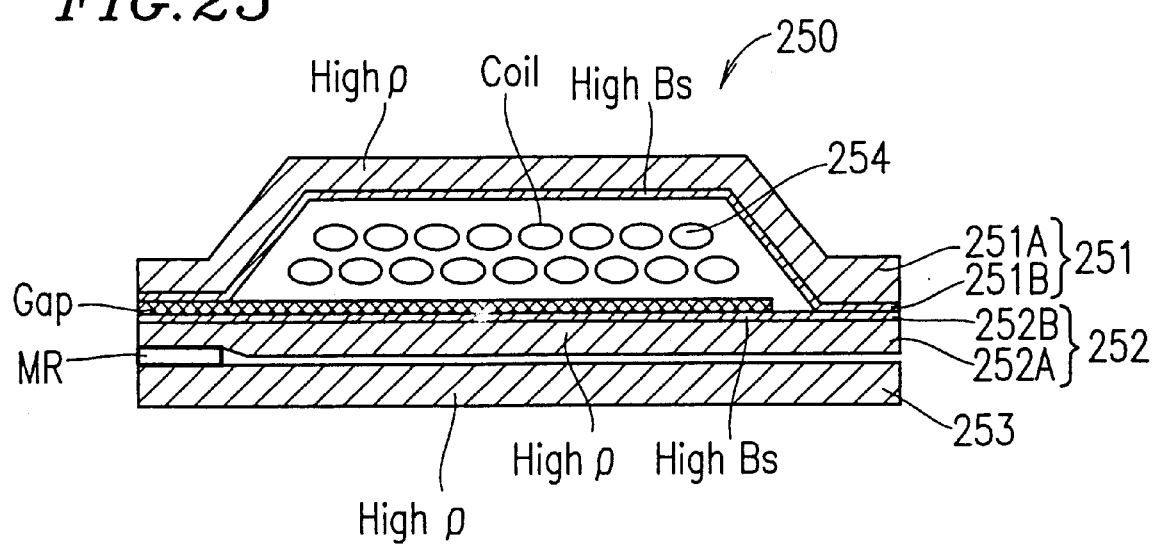
FIG. 25 is a schematic cross-sectional view of a thin film head using a magnetic film and a magnetic multilayer with high resistivity of Example 7 according to the present invention.

FIG. 25 shows a structure of a thin film head 250 of Example uc (see FIG. 34). The thin film head 250 includes an upper magnetic pole 251, a lower magnetic pole 252, a shield film 253, and a coil 254. The upper magnetic pole 251 contains a magnetic thin film 251B (thickness: about 0.5 $\mu$m), and a magnetic multilayer with high resistivity 251A (thickness: about 3.5 $\mu$m). The lower magnetic pole 252 contains a magnetic thin film 252B (thickness: about 0.5 $\mu$m), and a magnetic multilayer 252A (thickness: about 3.5 $\mu$m). The shield film 253 contains a magnetic multilayer.

Figure 26:
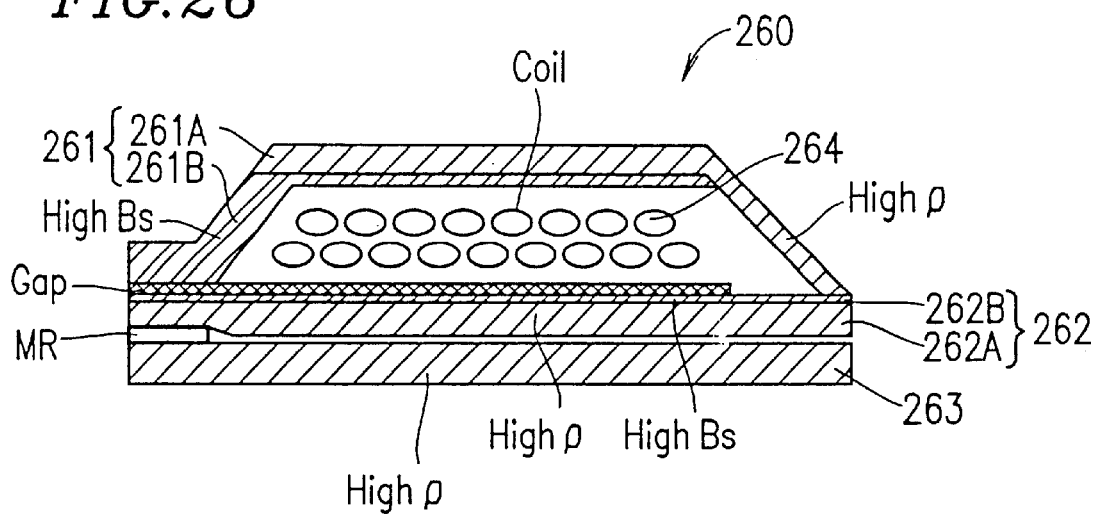
FIG. 26 is a schematic cross-sectional view of a thin film head using a magnetic film and a magnetic multilayer with high resistivity of Example 7 according to the present invention.

FIG. 26 shows a structure of a thin film head 260 of Example ud (see FIG. 34). The thin film head 260 includes an upper magnetic pole 261, a lower magnetic pole 262, a shield film 263, and a coil 264. The upper magnetic pole 261 contains a magnetic thin film 261B (maximum thickness: about 4 $\mu$m), and a magnetic multilayer with high resistivity 261A (maximum thickness: about 4 $\mu$m). The lower magnetic pole 262 contains a magnetic thin film 262B (thickness: about 0.5 $\mu$m), and a magnetic multilayer with high resistivity 262A (thickness: about 3.5 $\mu$m). The shield film 263 contains a magnetic multilayer with high resistivity.

Figure 27:
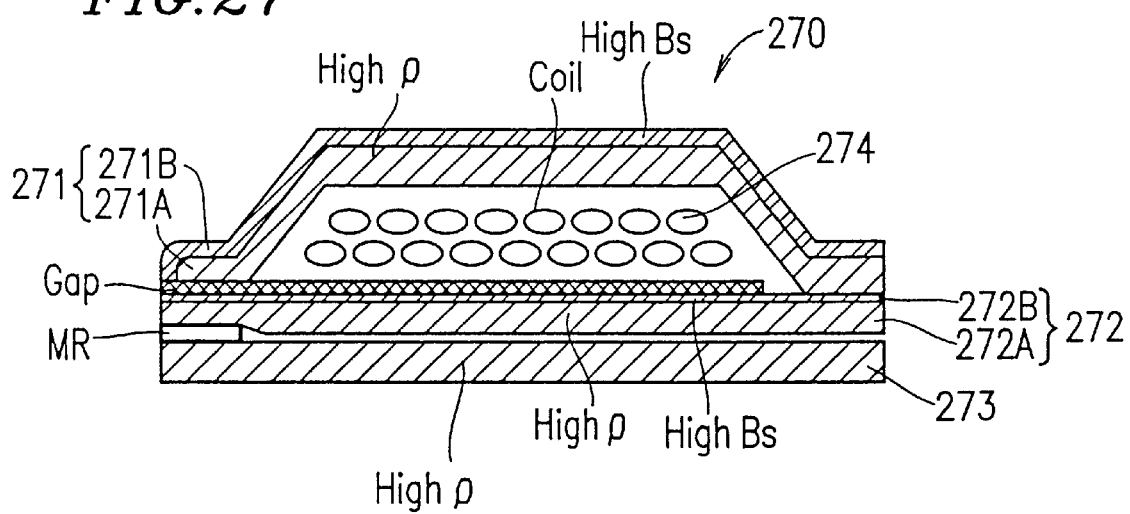
FIG. 27 is a schematic cross-sectional view of a thin film head using a magnetic film and a magnetic multilayer with high resistivity of Example 7 according to the present invention.

FIG. 27 shows a structure of a thin film head 270 of Example ue (see FIG. 34). The thin film head 270 includes an upper magnetic pole 271, a lower magnetic pole 272, a shield film 273, and a coil 274. The upper magnetic pole 271 contains a magnetic thin film 271B (thickness: about 0.5 $\mu$m) and a magnetic multilayer with high resistivity 271A (thickness: about 3.5 $\mu$m). The lower magnetic pole 272 contains a magnetic thin film 272B (thickness: about 0.5 $\mu$m), and a magnetic multilayer with high resistivity 272A (thickness: about 3.5 $\mu$m). The shield film 273 is formed of a magnetic multilayer with high resistivity.

Figure 28:
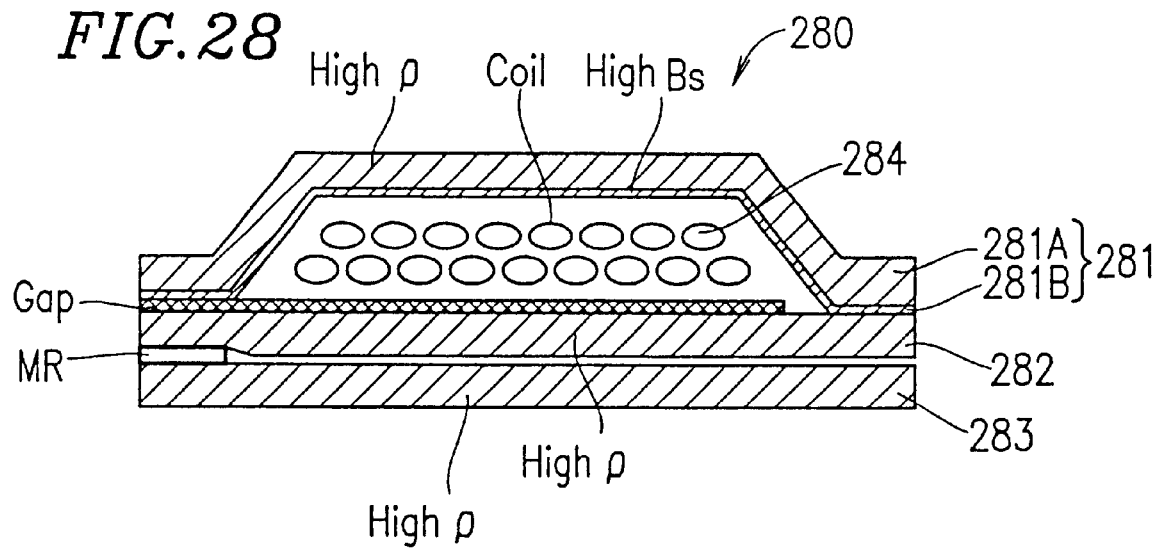
FIG. 28 is a schematic cross-sectional view of a thin film head using a magnetic film and a magnetic multilayer with high resistivity of Example 7 according to the present invention.

FIG. 28 shows a structure of a thin film head 280 of Example uf (see FIG. 34). The thin film head 280 includes an upper magnetic pole 281, a lower magnetic pole 282, a shield film 283, and a coil 284. The upper magnetic pole 281 contains a magnetic thin film 281B (thickness: about 0.5 $\mu$m), and a magnetic multilayer with high resistivity 281A (thickness: about 3.5 $\mu$m). The lower magnetic pole 282 is formed of a magnetic multilayer with high resistivity (thickness: about 4 $\mu$m). The shield film 283 is formed of a magnetic multilayer with high resistivity.

Figure 29:
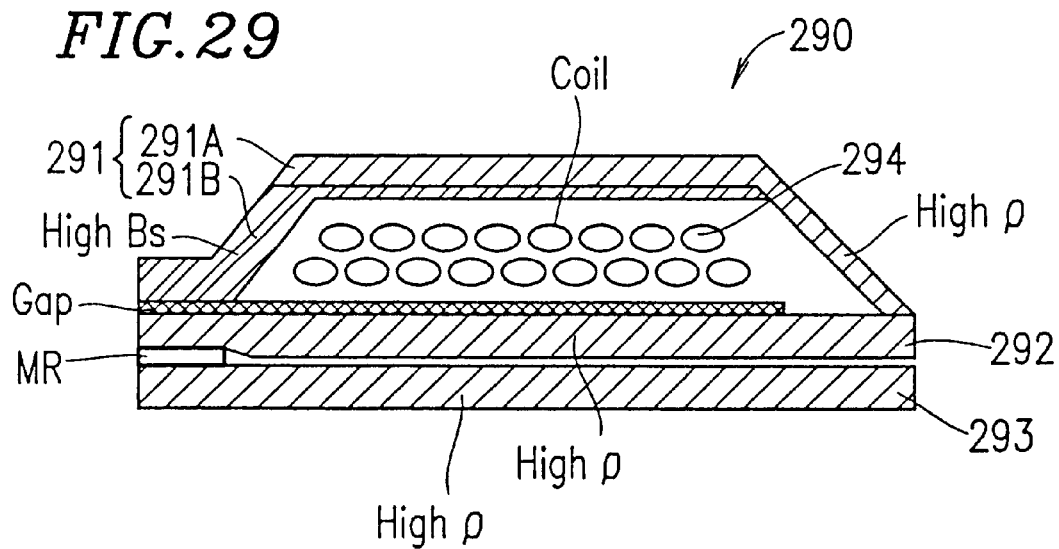
FIG. 29 is a schematic cross-sectional view of a thin film head using a magnetic film and a magnetic multilayer with high resistivity of Example 7 according to the present invention.

FIG. 29 shows a structure of a thin film head 290 of Example ug (see FIG. 34). The thin film head 290 includes an upper magnetic pole 291, a lower magnetic pole 292, a shield film 293, and a coil 294. The upper magnetic pole 291 contains a magnetic thin film 291B (maximum thickness: about 4 $\mu$m), and a magnetic multilayer with high resistivity 291A (maximum thickness: about 4 $\mu$m). The lower magnetic pole 292 is formed of a magnetic multilayer with high resistivity (thickness: about 4 $\mu$m). The shield film 293 is formed of a magnetic multilayer with high resistivity.

Figure 30:
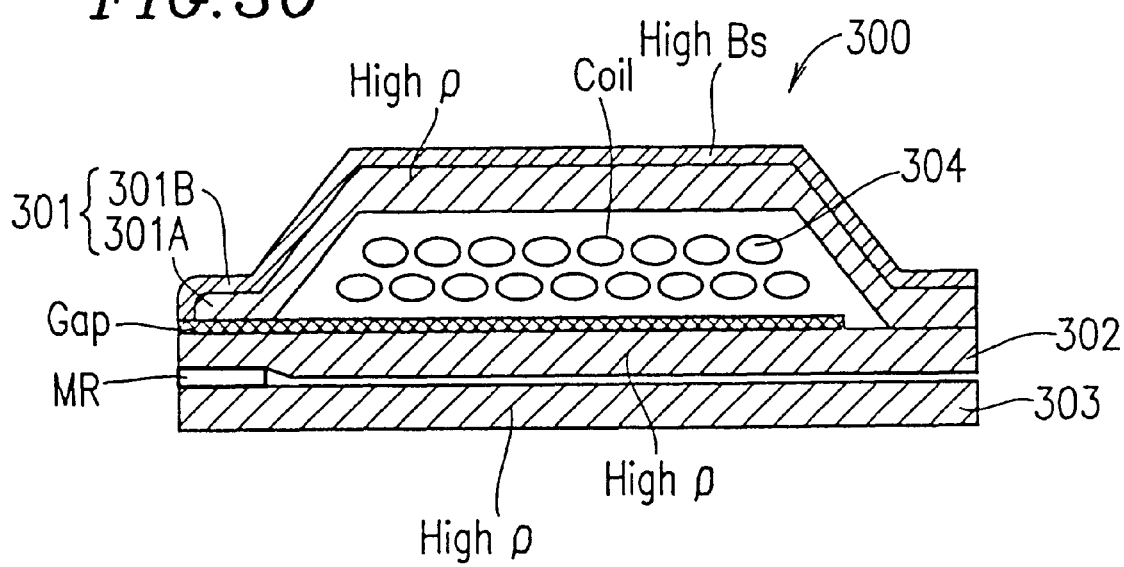
FIG. 30 is a schematic cross-sectional view of a thin film head using a magnetic film and a magnetic multilayer with high resistivity of Example 7 according to the present invention.

FIG. 30 shows a structure of a thin film head 300 of Example uh (see FIG. 34). The thin film head 300 includes an upper magnetic pole 301, a lower magnetic pole 302, a shield film 303, and a coil 304. The upper magnetic pole 301 contains a magnetic thin film 301B (thickness: about 0.5 $\mu$m), and a magnetic multilayer with high resistivity 301A (thickness: about 3.5 $\mu$m). The lower magnetic pole 302 is formed of a magnetic multilayer with high resistivity (thickness: about 4 $\mu$m). The shield film 303 is formed of a magnetic multilayer with high resistivity.

FIG. 31 shows a structure of a DC magnetron sputtering device 320 for producing films. The DC magnetron sputtering device 320 includes a rotator 361 which rotates with respect to a central axis 361A. A substrate 250 onto which a film is formed is provided on the rotator 361. The DC magnetron sputtering device 320 includes a high Bs vapor deposition source 261BS for forming a high Bs film on the substrate 250, and a high $\rho$ vapor deposition source 261AS for forming a high $\rho$ film on the substrate 250. A target size, a discharge gas pressure, and a substrate temperature are set to be about 5 inches, about 5 mTorr, and room temperature, respectively.

Figure 32A:
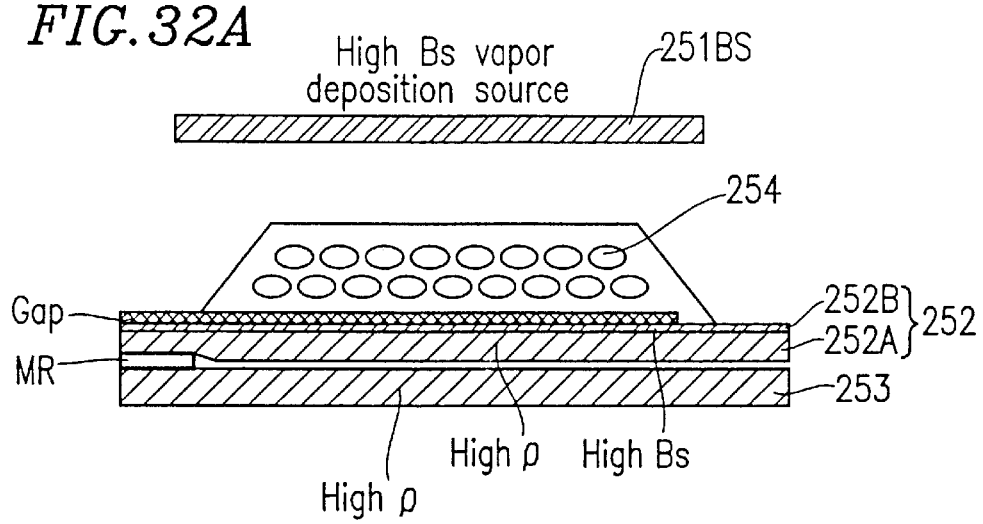
FIG. 32A illustrates a method for producing a thin film head using a magnetic film and a magnetic multilayer with high resistivity of Example 7 according to the present invention.
Figure 32B:
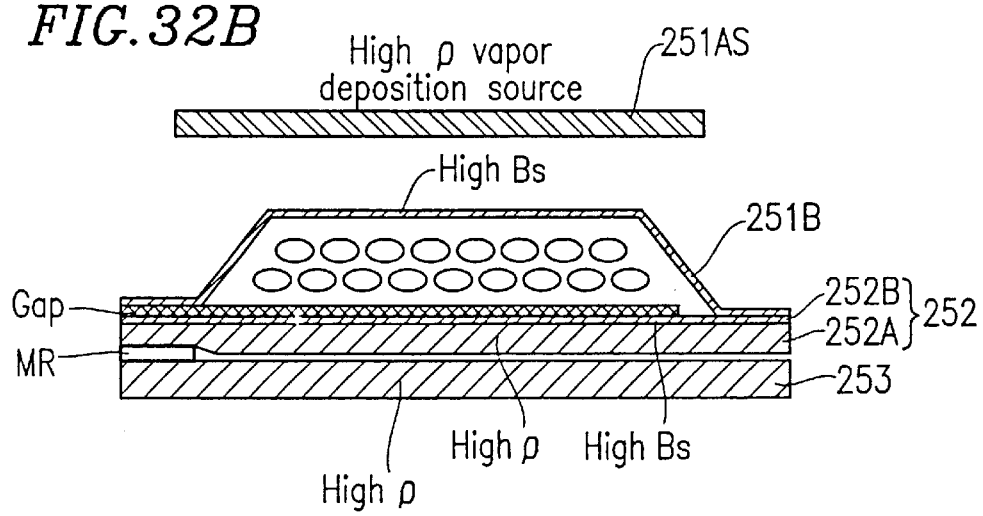
FIG. 32B illustrates a method for producing a thin film head using a magnetic film and a magnetic multilayer with high resistivity of Example 7 according to the present invention.
Figure 32C:
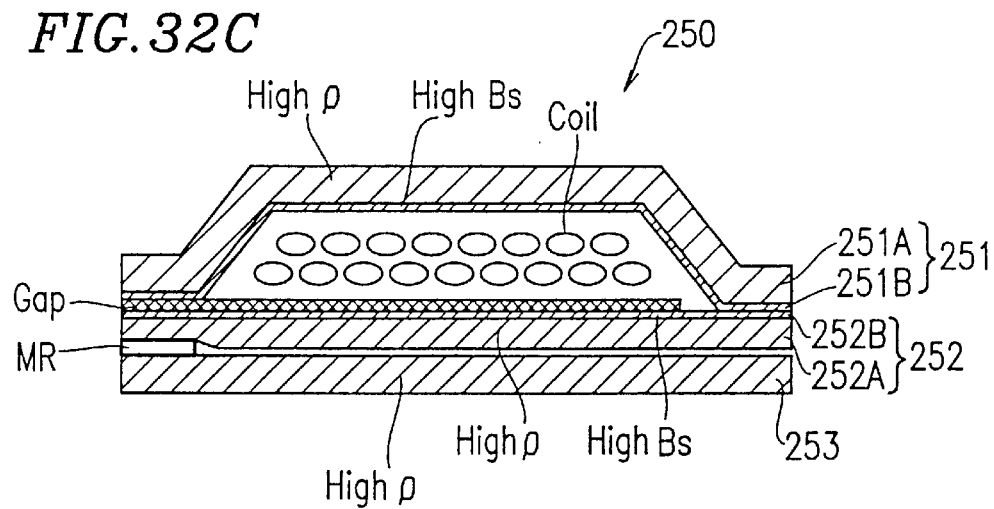
FIG. 32C illustrates a method for producing a thin film head using a magnetic film and a magnetic multilayer with high resistivity of Example 7 according to the present invention.

As shown in FIGS. 32A through 32C, for example, in the case of a thin film head 250 of Example uc, particularly when the upper magnetic pole 251 is formed on the coil 254, the magnetic thin film 251B (high Bs film) and the magnetic multilayer with high resistivity 251A (high $\rho$ film) are successively formed by using the high Bs vapor deposition source 251BS and the high $\rho$ vapor deposition source 251AS.

Figure 33A:
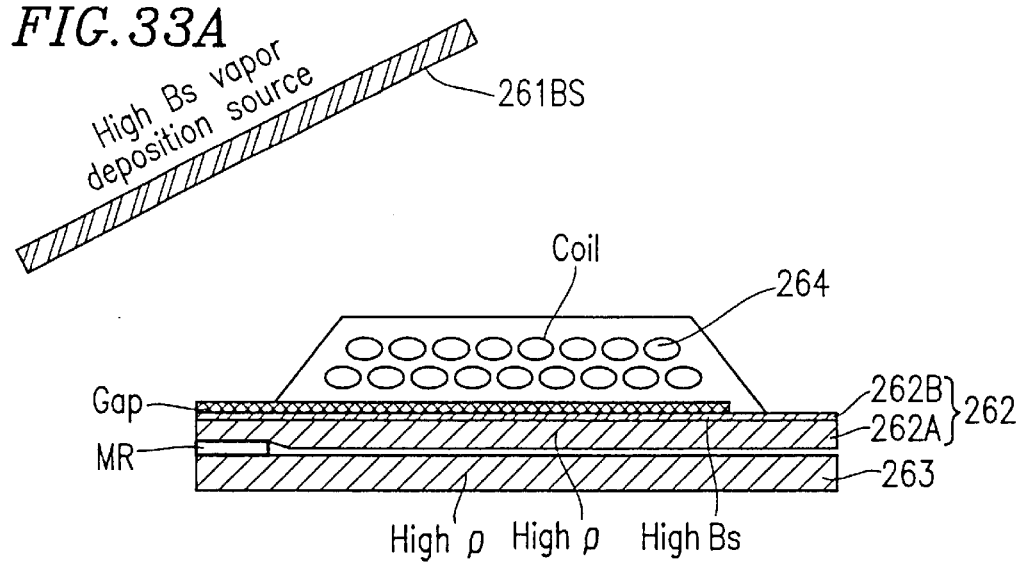
FIG. 33A illustrates another method for producing a thin film head using a magnetic film and a magnetic multilayer with high resistivity of Example 7 according to the present invention.
Figure 33B:
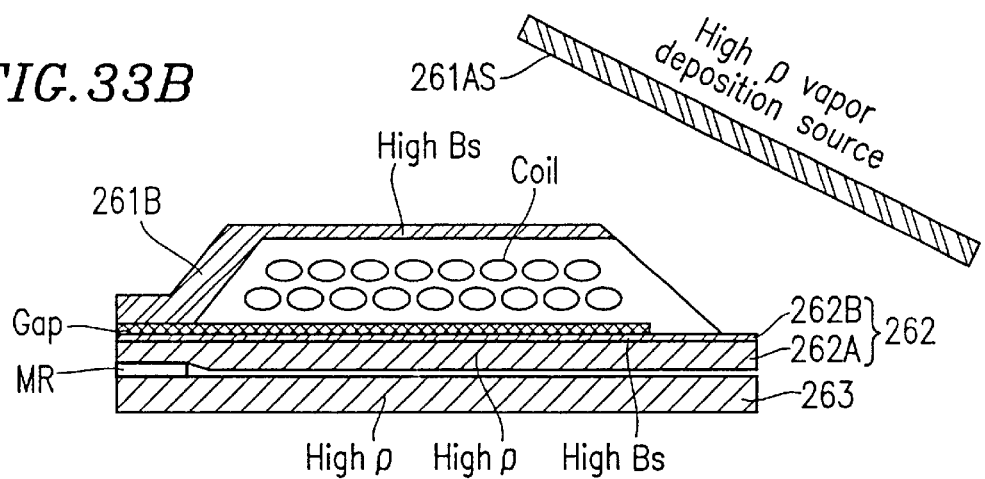
FIG. 33B illustrates still another method for producing a thin film head using a magnetic film and a magnetic multilayer with high resistivity of Example 7 according to the present invention.
Figure 33C:
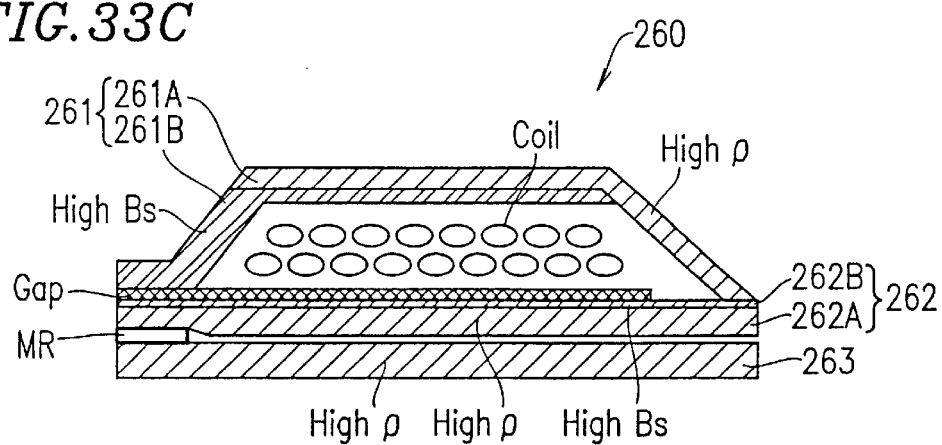
FIG. 33C illustrates still another method for producing a thin film head using a magnetic film and a magnetic multilayer with high resistivity of Example 7 according to the present invention.
Figure 35A:
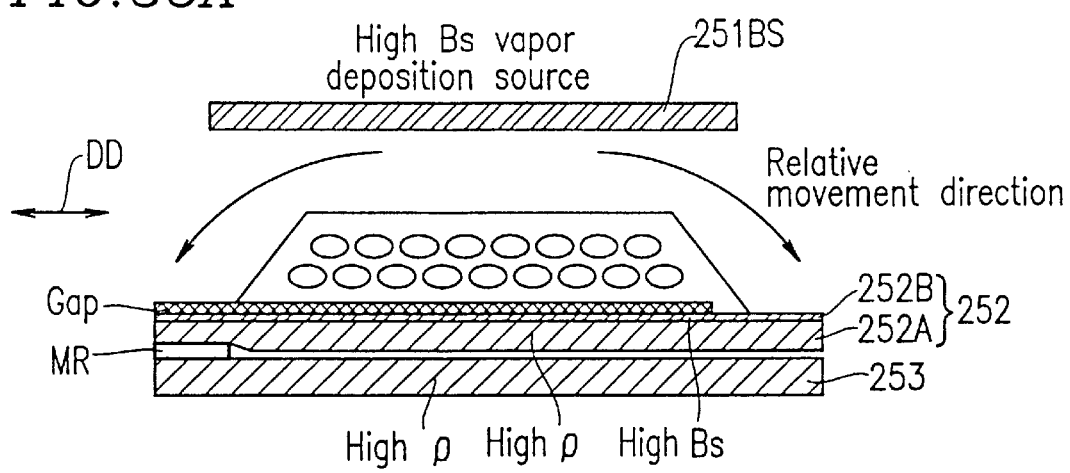
FIG. 35A illustrates still another method for producing a thin film head using a magnetic film and a magnetic multilayer with high resistivity of Example 7 according to the present invention.
Figure 35B:
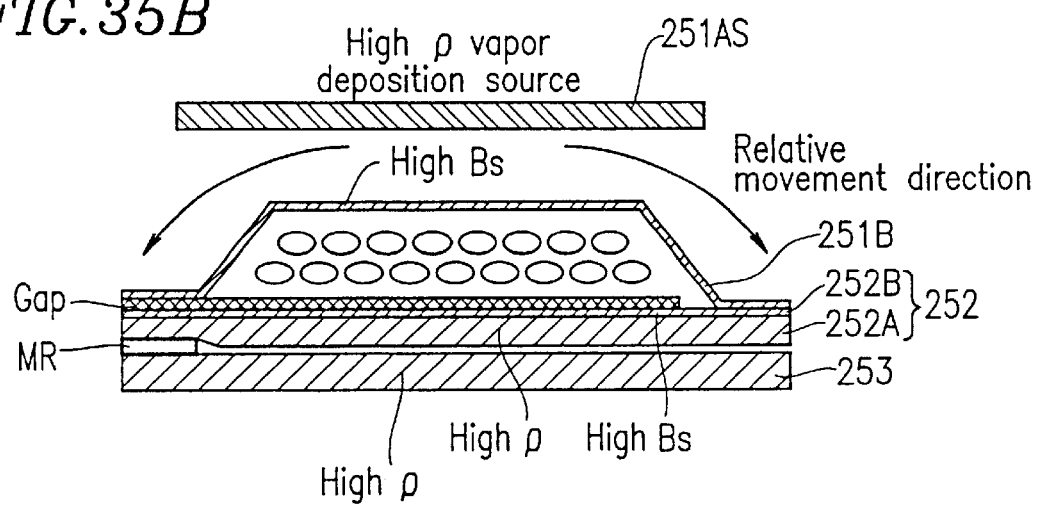
FIG. 35B illustrates still another method for producing a thin film head using a magnetic film and a magnetic multilayer with high resistivity of Example 7 according to the present invention.
Figure 35C:
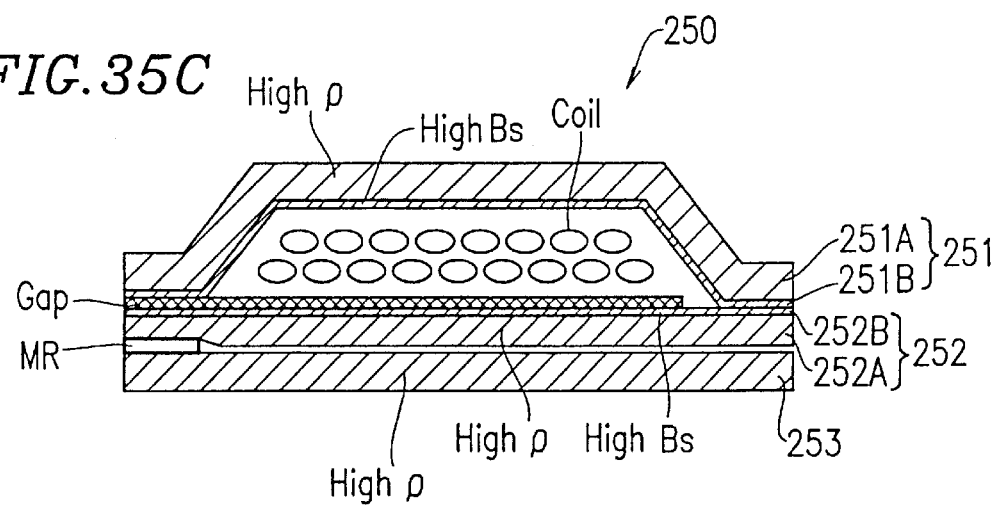
FIG. 35C illustrates still another method for producing a thin film head using a magnetic film and a magnetic multilayer with high resistivity of Example 7 according to the present invention.

As shown in FIGS. 33A through 33C, in the thin film head 260 of Example ud, the magnetic thin film 261B (high Bs film) is formed on the front side of a recording gap, and the magnetic multilayer with high resistivity 261A (high ρ film) is formed on the back side of the recording gap.

As shown in FIG. 34, compared with a thin film head using conventional magnetic poles made of permalloy, a thin film head using the magnetic thin film and the magnetic multilayer with high resistivity of the present invention as magnetic poles exhibits outstanding overwrite characteristics at a low recording current. This is due to the magnetic material used in the present invention, which has a high saturated magnetic flux density or high specific resistance, and has outstanding soft magnetic characteristics, with a domain structure controlled.

Accordingly, outstanding overwrite characteristics are exhibited at a relatively low recording current in a thin film head having a structure in which at least an upper magnetic pole is composed of a magnetic multilayer with high resistivity (specific resistance: about 80 μΩcm or more) and a magnetic thin film or a magnetic multilayer with high resistivity having the above-mentioned structure, and the magnetic thin film or the magnetic multilayer is formed at least in the vicinity of a recording gap at an end portion of the upper magnetic pole; and a thin film head having a structure in which a magnetic thin film or a magnetic multilayer with the above-mentioned structure is formed at least on a recording gap, and a magnetic multilayer with high resistivity (specific resistance: about 80 μΩcm or more) is formed on the magnetic thin film or the magnetic multilayer. These thin film heads can be obtained by a relatively easy process.

Example 8

The present example describes a method for producing a recording magnetic pole of a thin film head while changing a relative position between a thin film head and a target.

Figure 36A:
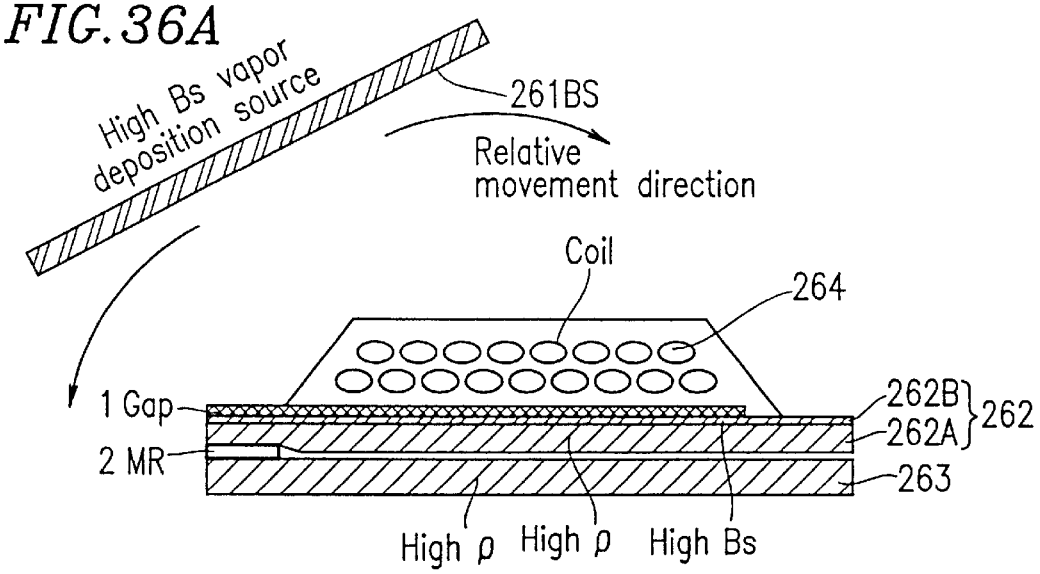
FIG. 36A illustrates still another method for producing a thin film head using a magnetic film and a magnetic multilayer with high resistivity of Example 7 according to the present invention.
Figure 36B:
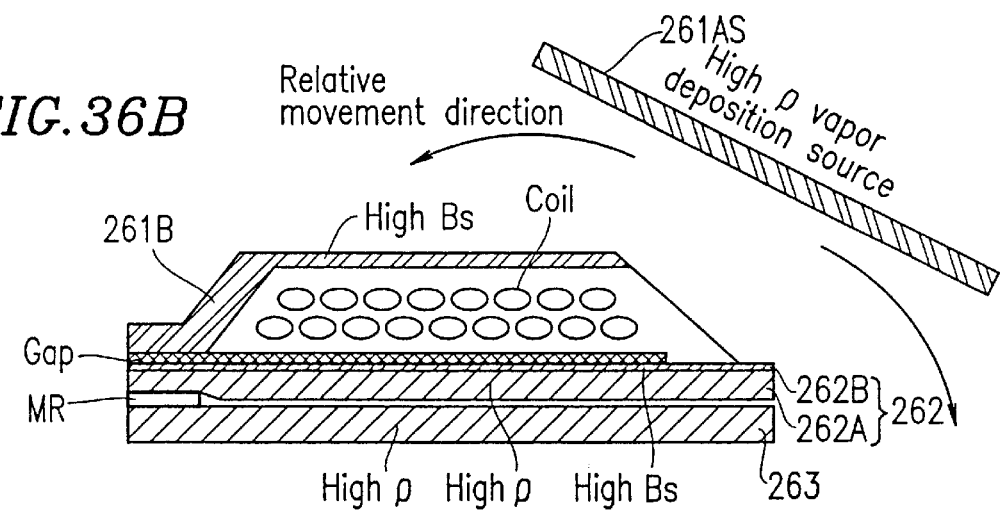
FIG. 36B illustrates still another method for producing a thin film head using a magnetic film and a magnetic multilayer with high resistivity of Example 7 according to the present invention.
Figure 36C:
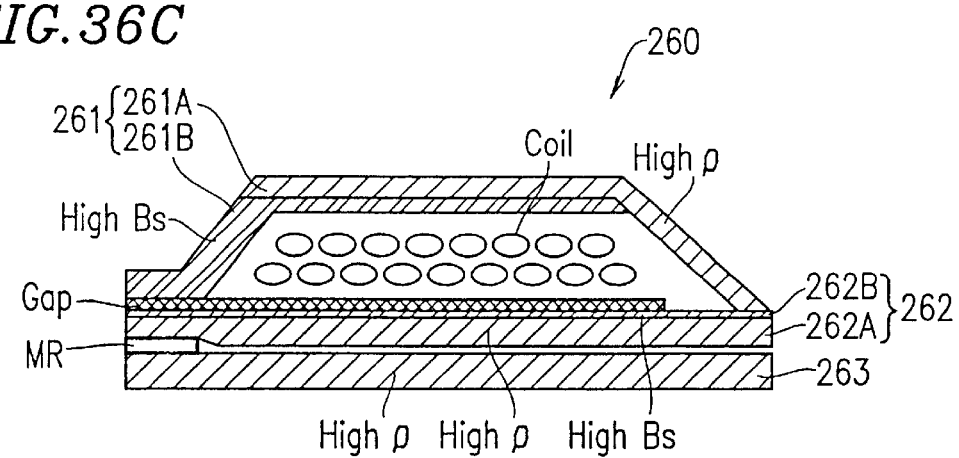
FIG. 36C illustrates still another method for producing a thin film head using a magnetic film and a magnetic multilayer with high resistivity of Example 7 according to the present invention.
Figure 36D:
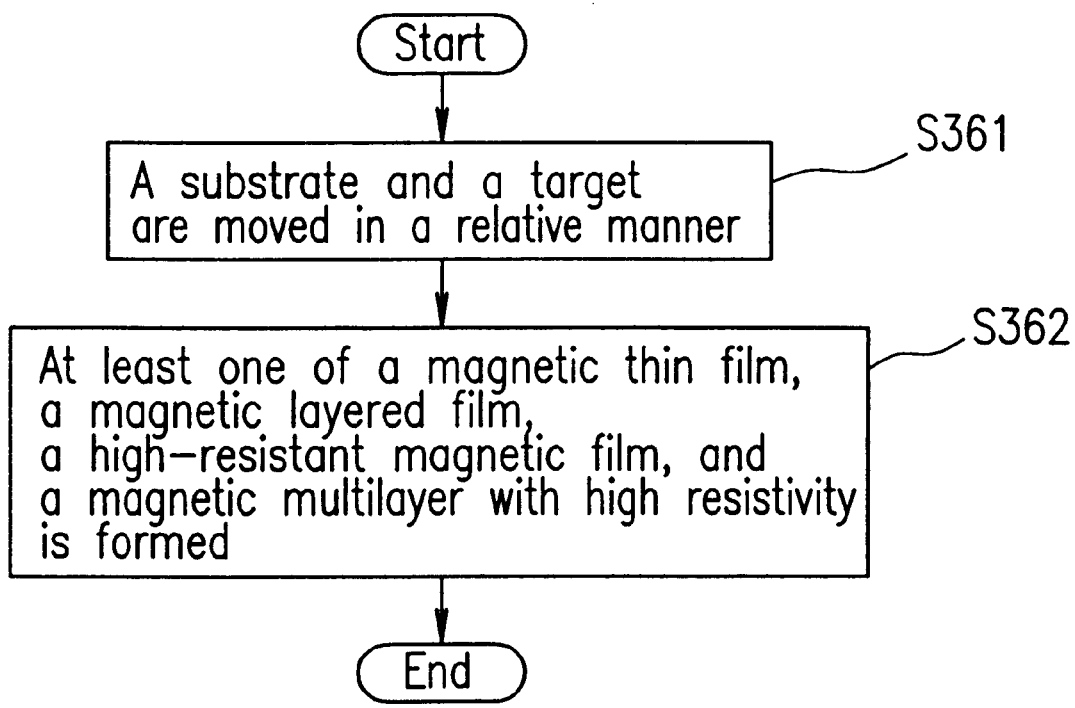
FIG. 36D is a flow chart of still another method for producing a thin film head using a magnetic film and a magnetic multilayer with high resistivity of Example 7 according to the present invention.

FIGS. 35A through 35C and FIGS. 36A through 36C illustrate other methods for producing a thin film head using a magnetic thin film and a magnetic multilayer with high resistivity of the present invention. FIG. 36D is a flow chart illustrating other methods for producing a thin film head using a magnetic thin film and a magnetic multilayer with high resistivity. In the present example, the DC magnetron sputtering device 320 shown in FIG. 31 is used, and a target size, a discharge gas pressure, and a substrate temperature are set to be about 5×15 inches, about 5 mTorr, and about 20° C., respectively.

In FIGS. 35A through 35C, FIGS. 36A through 36C, and FIG. 36D, $Fe_{94}Si_6$ is used as target material. First, a target is fixed, and a substrate is reciprocated in a shorter direction of the target (S361), whereby at least one of a magnetic thin film, a magnetic multilayer, a high-resistant magnetic film, and a magnetic multilayer with high resistivity is formed (S362). Herein, the shorter direction refers to a depth direction DD (FIG. 35A) of an upper magnetic pole of a thin film head. A movement speed is set to be about 2 rpm, and a change angle of movement is in a range of about ±0° to about 45°. In the device used in the present example, when the change angle of movement of the substrate exceeds about 20° to about 30°, a film formation speed becomes about ⅕ or less that of the case where the change angle is 0°. More specifically, as the change angle increases, a distance between the target and the substrate is increased, and the number of sputtering particles scattering from the target to the substrate is greatly decreased.

The films thus obtained are examined for soft magnetic characteristics, and their cross-sectional structures are observed with a TEM. FIG. 37 shows the results.

As shown in FIG. 37, compared with the case where the relative position between the target and the substrate is fixed, in the case where the target is moved in a relative manner, a magnetization difficult axis of a film is formed in a direction in which the target is moved, and soft magnetic characteristics are enhanced. The direction of the magnetization difficult axis is not related to the direction of a leakage magnetic field on the target, and depends upon the method for forming a film of the present example. When the cross-section of the film of Comparative Example va is observed with a TEM, column-shaped or needle-shaped crystal grains are formed. On the other hand, when the cross-section of the film of Example vc is observed with a TEM, a layered structure of a microcrystalline layer of about 3 nm and an amorphous layer of about 1 to about 2 nm is formed. More specifically, in spite of the fact that films are formed under the same sputtering conditions, by changing a positional relationship between the substrate and the target in a particular direction, a film formation speed is changed in a cyclic manner, energy or an average free passage of sputtering particles incident upon the substrate is changed, an angle at which sputtering particles are incident upon the substrate is changed, and the like. As a result, the above-mentioned layered structure is naturally formed.

Furthermore, the amorphous layer contains more oxygen than the microcrystalline layer. Stress in a film obtained from a warpage amount of the substrate is decreased as the cycle of the layered structure becomes shorter. This is because films are formed with a large change angle at a constant movement speed.

Example 9

A hard disk drive using a thin film head of the present invention will be described with reference to FIGS. 38 and 39.

Figure 38:
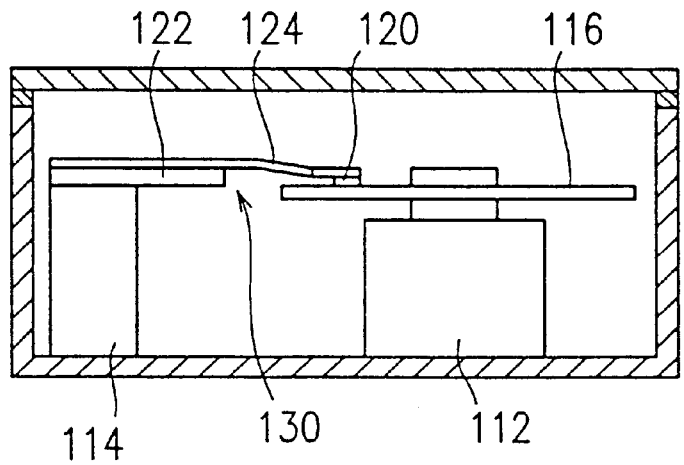
FIG. 38 is a side view of a hard disk apparatus of the present invention.
Figure 39:
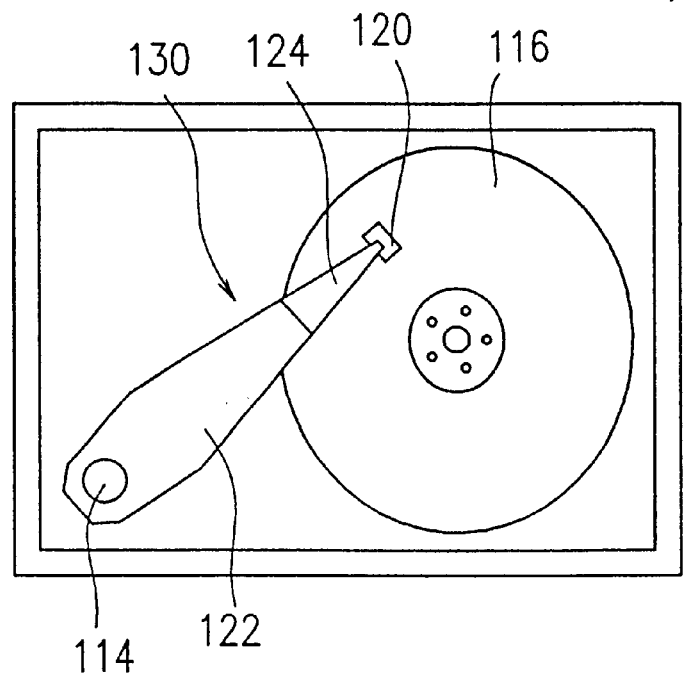
FIG. 39 is a plan view of the hard disk apparatus of the present invention.
Figure 40:
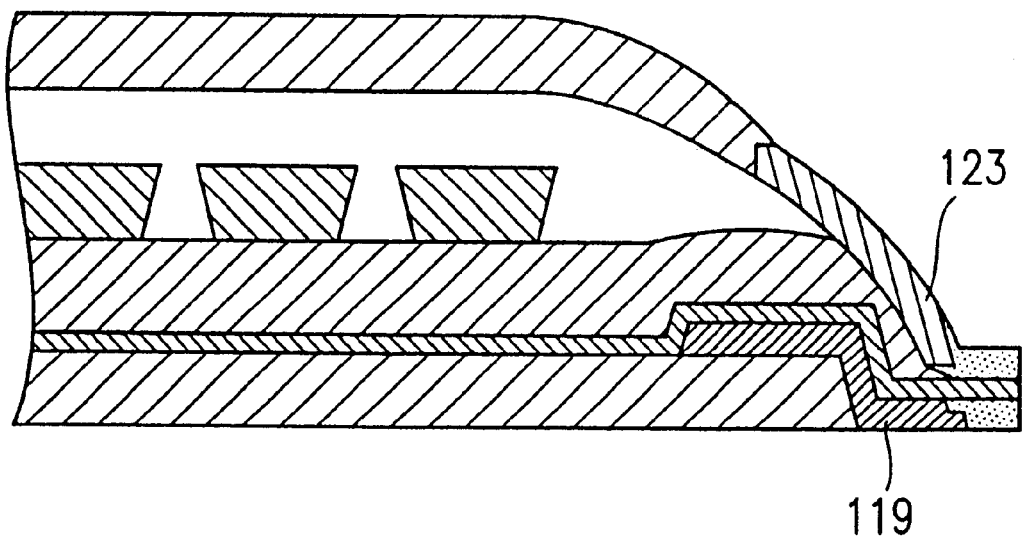
FIG. 40 is a view illustrating a conventional thin film magnetic layer.

FIG. 38 is a side view of a hard disk drive 110 using a thin film head of the present example. FIG. 39 is a plan view thereof.

The hard disk drive 110 includes a slider 120 for holding a thin film head of the present invention, a head supporting mechanism 130 for supporting the slider 120, an actuator 114 for tracking a thin film head via the head supporting mechanism 130, and a disk drive motor 112 for driving a disk 116. The head supporting mechanism 130 includes an arm 122 and a suspension 124.

The disk drive motor 112 drives the disk 116 at a predetermined speed. The actuator 114 moves the slider 120 holding the thin film head in a radial direction across the surface of the disk 116 in such a manner that the thin film head can access a predetermined data track of the disk 116. The actuator 114 is typically a linear or rotary voice coil motor.

The slider 120 holding the thin film head is, for example, an air bearing slider. In this case, the slider 120 comes into contact with the surface of the disk 116 upon boot-up or halting of the hard disk drive 110. When information is recorded onto or reproduced from the hard disk drive 110, the slider 120 is maintained on the surface of the disk 116 by an air bearing formed between the rotating disk 116 and the slider 120. The thin film head held on the slider 120 records information onto or reproduces it from the disk 116.

As described above, by using a magnetic thin film, a magnetic multilayer, a high-resistant magnetic film, and a magnetic multilayer with high resistivity having the composition and structure of the present invention, and a method for producing the same, it is possible to provide a magnetic material which has outstanding soft magnetic characteristics at a high frequency and has a high saturated magnetic flux density or a high specific resistance, even after being formed into a minute shape in a process at a low temperature (i.e., about 300° C. or less). Furthermore, the magnetic thin film and the magnetic multilayer have excellent processability to a minute shape, and can be layered at a high speed. Still further, these films can be provided with anisotropy without being heat-treated in a magnetic field. Therefore, mass-production and reliability of magnetic devices using these films are enhanced, and processing apparatuses and vapor growth apparatuses can be produced easily at a low cost.

Furthermore, by using the magnetic thin film, the magnetic multilayer, the high-resistant magnetic film, and the magnetic multilayer with high resistivity of the present invention, thin film heads for high-density recording, having outstanding mass-productivity can be obtained. In addition, the power consumption of an apparatus using such a thin film head can be decreased, so that an information processing apparatus can be miniaturized, rendered light-weight, and used continuously for a long period of time.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A magnetic film comprising a substantially crystalline magnetic layer and an intermediate layer alternately formed in contact with each other, wherein the magnetic layer has a composition represented by $(M_1\alpha_1X_1\beta_1)_{100-\delta_1}A_1\delta_1$ (where $\alpha_1$, $\beta_1$, and $\delta_1$ represent % by atomic weight; $M_1$ is at least one magnetic metal selected from the group consisting of Fe, Co, and Ni; $X_1$ is at least one selected from the group consisting of Mg, Ca, Sr, Ba, Si, Ge, Sn, Al, Ga, and transition metals excluding the $M_1$; and $A_1$ is at least one selected from the group consisting of O and N), the magnetic layer has the following composition range:
$0.1 \leq \beta_1 \leq 12$
$\alpha_1 + \beta_1 = 100$
$0 < \delta_1 \leq 10$ the intermediate layer has a composition represented by $(M_2\alpha_2X_2\beta_2)_{100-\delta_2}A_2\delta_2$ (where $\alpha_2$, $\beta_2$, and $\delta_2$ represent % by atomic weight, $M_2$ is at least one magnetic metal selected from the group consisting of Fe, Co, and Ni; $X_2$ is at least one selected from the group consisting of Mg, Ca, Sr, Ba, Si, Ge, Sn, Al, Ga, Ge and transition metals excluding the $M_2$; and $A_2$ is O), the intermediate layer has the following composition range:
$0.1 \leq \beta_2 \leq 80$
$\alpha_2 + \beta_2 = 100$
$\delta_1 \leq \delta_2 \leq 67$.

2. A magnetic film according to claim 1, wherein the $X_1$ contains at least one selected from the group consisting of Si, Al, Ti, and V.

3. A magnetic film according to claim 1, wherein $M_1=M_2$ and $X_1=X_2$.

4. A magnetic film according to claim 1, wherein assuming that an average thickness of the magnetic layer is $T_1$ and an average thickness of the intermediate layer is $T_2$, the following expressions are satisfied:
2 nm $\leq T_1 \leq$ 150 nm
0.4 nm $\leq T_2 \leq$ 15 nm
$1 \leq T_1/T_2 \leq 50$.

5. A magnetic film according to claim 4, wherein the average thickness of the magnetic layer and the average thickness of the intermediate layer included in the magnetic film satisfy the following expressions:
20 nm $< T_1 \leq$ 150 nm
1 nm $< T_2 \leq$ 15 nm
$4 \leq T_1/T_2 \leq 50$
and, wherein at least 50% of crystal grains in the magnetic layers adjacent the intermediate layer extend across the intermediate layer.

6. A hard disk drive using the magnetic film of claim 1 as a magnetic pole.

7. A hard disk drive using the magnetic film of claim 1 as a part of a shield.

8. A magnetic film comprising a substantially crystalline magnetic layer and an intermediate layer alternately formed in contact with each other, wherein the magnetic layer has a composition represented by $(M_1\alpha_1X_1\beta_1)_{100-\delta_1}A_1\delta_1$ (where $\alpha_1$, $\beta_1$, and $\delta_1$ represent % by atomic weight; $M_1$ is a least one magnetic metal selected from the group consisting of Fe, Co, and Ni; $X_1$ is at least one selected from the group consisting of Mg, Ca, Sr, Ba, Si, Ge, Al, Ga, Cr, IVa group elements, Va group elements and transition metals; and $A_1$ is at least one selected from the group consisting of O and N), the magnetic layer has the following composition range:
$0.1 \leq \beta_1 \leq 12$
$\alpha_1 + \beta_1 = 100$
$0 \leq \delta_1 \leq 10$ the intermediate layer has a composition represented by $(M_2\alpha_2X_2\beta_2)_{100-\delta_2}A_2\delta_2$ (where $\alpha_2$, $\beta_2$, and $\delta_2$ represent % by atomic weight, $M_2$ is at least one magnetic metal selected from the group consisting of Fe, Co, and Ni; $X_2$ is at least one selected from the group consisting of Mg, Ca, Sr, Ba, Si, Al, Ga, Ge, Cr, IVa group elements, Va group elements and transition metals; and $A_2$ is O), the intermediate layer has the following composition range:
$0.1 \leq \beta_2 \leq 80$
$\alpha_2 + \beta_2 = 100$
$\delta_1 < \delta_2 \leq 67$.

9. A magnetic film according to claim 8, wherein the $X_1$ contains at least one selected from the group consisting of Si, Al, Ti, and V.

10. A magnetic film according to claim 8, wherein $M_1=M_2$ and $X_1=X_2$.

11. A hard disk drive using the magnetic film of claim 8 as a magnetic pole.

12. A hard disk drive using the magnetic film of claim 8 as a part of a shield.

13. A magnetic film comprising a substantially crystalline magnetic layer and an intermediate layer alternately formed in contact with each other, wherein the magnetic layer has a composition represented by $(M_1\alpha_1X_1\beta_1)_{100-\delta_1}A_1\delta_1$ (where $\alpha_1$, $\beta_1$, and $\delta_1$ represent % by atomic weight; $M_1$ is at least one magnetic metal selected from the group consisting of Fe, Co, and Ni; $X_1$ is at least one selected from the group consisting of Mg, Ca, Sr, Ba, Si, Ge, Al, Ga, Cr, IVa group elements, Va group elements and transition metals; and $A_1$ is at least one selected from the group consisting of O and N), the magnetic layer has the following composition range:
$0.1 \leq \beta_1 \leq 12$
$\alpha_1 + \beta_1 = 100$
$0 \leq \delta_1 \leq 10$ the intermediate layer has a composition represented by $(M_2\alpha_2X_2\beta_2)_{100-\delta_2}A_2\delta_2$ (where $\alpha_2$, $\beta_2$, and $\delta_2$ represent % by atomic weight, $M_2$ is at least one magnetic metal selected from the group consisting of Fe, Co, and Ni; $X_2$ is at least one selected from the group consisting of Mg, Ca, Sr, Ba, Si, Al, Ga, Ge, Cr, IVa group elements, Va group elements and transition metals; and $A_2$ is at least one selected from the group consisting of O and N), the intermediate layer has the following composition range:
$0.1 \leq \beta_2 \leq 80$
$\alpha_2 + \beta_2 = 100$
$\delta_1 < \delta_2 \leq 67$, wherein assuming that an average thickness of the magnetic layer is $T_1$ and an average thickness of the intermediate layer is $T_2$, the following expressions are satisfied:
$2$ nm $\leq T_1 \leq 150$ nm
$0.4$ nm $\leq T_2 \leq 15$ nm
$1 \leq T_1/T_2 \leq 50$.

14. A magnetic film according to claim 13, wherein the average thickness of the magnetic layer and the average thickness of the intermediate layer included In the magnetic film satisfy the following expressions:
$20$ nm $< T_1 \leq 150$ nm
$1$ nm $< T_2 \leq 15$ nm
$4 \leq T_1/T_2 \leq 50$ and, wherein at least 50% of crystal grains in the magnetic layers adjacent the intermediate layer extend across the intermediate layer.

15. A magnetic film comprising a substantially crystalline magnetic layer and an intermediate layer alternately formed, wherein the magnetic layer has a composition represented by $(M_1\alpha_1X_1\beta_1Z_1\gamma_1)_{100-\delta_1}A_1\delta_1$ (where $\alpha_1$, $\beta_1$, and $\delta_1$ represent % by atomic weight; $M_1$ is at least one magnetic metal selected from the group consisting of Fe, Co, and Ni; $X_1$ is at least one selected from the group consisting of Mg, Ca, Sr, Ba, Si, Al, Ga, Ge, Cr, IVa group elements, Va group elements and transition metals; $Z_1$ is at least one selected from the group consisting of Zn, Rh, Ru, and Pt; and $A_1$ is at least one selected from the group consisting of O and N), the magnetic layer has the following composition range:
$0.1 \leq \beta_1 \leq 12$
$0.1 \leq \gamma_1 \leq 8$
$\alpha_1 + \beta_1 + \gamma_1 = 100$
$0 \leq \delta_1 \leq 10$ the intermediate layer has a composition represented by $(M_2\alpha_2X_2\beta_2Z_2\gamma_2)_{100-\delta_2}A_2\delta_2$ (where $\alpha_2$, $\beta_2$, $\gamma_2$, and $\delta_2$ represented by atomic weight, $M_2$ is at least one magnetic metal selected from the group consisting of Fe, Co, and Ni; $X_2$ is at least one selected from the group consisting of Mg, Ca, Sr, Ba, Si, Al, Ga, Ge, Cr, IVa group elements, Va group elements and transition metals; $Z_2$ is at least one selected from the group consisting of Rh, Ru, and Pt; and $A_2$ is at least one selected from the group consisting of O and N), the intermediate layer has the following composition range:
$0.1 \leq \beta_2 \leq 80$
$0.1 \leq \gamma_2 \leq 80$
$\alpha_2 + \beta_2 + \gamma_2 = 100$
$\delta_1 < \delta_2 \leq 67$.

16. A magnetic film according to claim 15, wherein the $X_1$ contains at least one selected from the group consisting of Si, Al, Ti, and V.

17. A magnetic film according to claim 15, wherein $M_1 = M_2$ and $X_1 = X_2$.

18. A magnetic film according to claim 15, wherein $A_2$ contains O.

19. A magnetic film according to claim 15, wherein assuming that an average thickness of the magnetic layer is $T_1$ and an average thickness of the intermediate layer is $T_2$, the following expressions are satisfied:
$2$ nm $\leq T_1 \leq 150$ nm
$0.4$ nm $\leq T_2 \leq 15$ nm
$1 \leq T_1/T_2 \leq 50$.

20. A magnetic film according to claim 19, wherein the average thickness of the magnetic layer and the average thickness of the intermediate layer included in the magnetic film satisfy the following expressions:
$20$ nm $< T_1 \leq 150$ nm
$1$ nm $< T_2 \leq 15$ nm
$4 \leq T_1/T_2 \leq 50$ and, wherein at least 50% of crystal grains in the magnetic layers adjacent the intermediate layer extend across the intermediate layer.

21. A hard disk drive using the magnetic film of claim 15 as a magnetic pole.

22. A hard disk drive using the magnetic film of claim 15 as a part of a shield.

23. A hard disk drive using a thin film head including the magnetic film of claim 16.

24. A hard disk drive using a thin film head including the magnetic film of claim 17.

25. A high-resistant magnetic film having a composition represented by $M_\alpha X\beta(N_\delta O_\epsilon)_\gamma$ (where $\alpha$, $\beta$, $\gamma$, $\delta$, and $\epsilon$ represent % by atomic weight; M is at least one magnetic metal selected from the group consisting of Fe, Co, and Ni; X is at least one selected from the group consisting of Mg, Ca, Sr, Ba, Si, Ge, Sn, Al, and Ga), wherein assuming that a chemical formula when the X forms a nitride with a lowest nitride generation free energy is $(X)N_m$ and a chemical formula when the X forms an oxide with a lowest oxygen generation free energy is $(X)O_n$ the high-resistant magnetic film has the following composition range:
$\alpha + \beta + \gamma = 100$
$45 \leq \alpha \leq 78$
$\delta + \epsilon = 100$
$1 < 100 \times \gamma/\beta/(m \times \delta + n \times \epsilon) < 2.5$ the high-resistant magnetic film contains crystal grains, and a shortest diameter of each of the crystal grains is 20 nm or less.

26. A hard disk drive using the high-resistant magnetic film of claim 25 as a magnetic pole.

27. A hard disk drive using the high-resistant magnetic film of claim 25 as a part of a shield.

28. A magnetic, multilayer comprising a magnetic thin film and a high-resistant layer alternately formed wherein where an average thickness of the magnetic thin film is $T_3$, and an average thickness of the high-resistant layer is $T_4$, the following expressions are satisfied:
$100$ nm $\leq T_3 \leq 1000$ nm
$2$ nm $\leq T_4 \leq 50$ nm
$10 \leq T_3/T_4 \leq 500$ and wherein the magnetic thin film includes a substantially crystalline magnetic layer and an intermediate layer, the magnetic layer, the intermediate layer, and the high-resistant layer have compositions represented by $M_1X_1A_1$, $M_2X_2A_2$, and $M_3X_3A_3$, respectively (where $M_1$ to $M_3$ are at least one magnetic metal selected from the group consisting of Fe, Co, and Ni; $X_1$, $X_2$, and $X_3$ are at least one selected from the group consisting of Mg, Ca, Sr, Ba, Si, Ge, Sn, Al, Ga, and transition metals excluding the magnetic metal; and $A_1$, $A_2$, and $A_3$ are at least one selected from the group consisting of O and N), and the magnetic layer, the intermediate layer, and the high-resistant layer at least satisfy the conditions: $M_1=M_2=M_3$, and $X_1=X_2=X_3$.

\* \* \* \* \*

UNITED STATES PATENT AND TRADEMARK OFFICE
CERTIFICATE OF CORRECTION

PATENT NO. : 6,632,520 B1
DATED : October 14, 2003
INVENTOR(S) : Hiramoto et al.

It is certified that error appears in the above-identified patent and that said Letters Patent is hereby corrected as shown below:

Column 33,
Line 35, replace "$(M_1\alpha_1X_1\beta_1Z_1\gamma_1)_{100-\delta 1}A_1\delta_1$" with -- $(M_1\alpha_1X_1\beta_1Z_1\gamma_1)_{100-\delta_1}A_1\delta_1$ --.
Line 50, replace "$(M_2\alpha_2X_2\beta_2Z_2\gamma_2)_{100-\delta 2}A_2\delta_2$" with -- $(M_2\alpha_2X_2\beta_2Z_2\gamma_2)_{100-\delta_2}A_2\delta_2$ --.

Signed and Sealed this

Twenty-third Day of December, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,632,520 B1
DATED        : October 14, 2003
INVENTOR(S)  : Hiramoto et al.

It is certified that error appears in the above-identified patent and that said Letters Patent is hereby corrected as shown below:

<u>Column 4,</u>
Line 32, replace "$0.1 \leq \gamma_2 \leq 80$" with -- $0.1 \leq \gamma_2 \leq 8$ --

<u>Column 33,</u>
Line 35, replace "$\alpha_1, \beta_1,$ and $\delta_1$" with -- $\alpha_1, \beta_1, \gamma_1,$ and $\delta_1$ --
Line 62, replace "$0.1 \leq \gamma_2 \leq 80$" with -- $0.1 \leq \gamma_2 \leq 8$ --

Signed and Sealed this

Thirteenth Day of April, 2004

JON W. DUDAS
*Acting Director of the United States Patent and Trademark Office*